(12) United States Patent
Shibata

(10) Patent No.: US 10,037,812 B2
(45) Date of Patent: *Jul. 31, 2018

(54) SEMICONDUCTOR MEMORY DEVICE CAPABLE OF SHORTENING ERASE TIME

(71) Applicant: Toshiba Memory Corporation, Minato-ku (JP)

(72) Inventor: Noboru Shibata, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/422,640

(22) Filed: Feb. 2, 2017

(65) Prior Publication Data

US 2017/0148524 A1 May 25, 2017

Related U.S. Application Data

(63) Continuation of application No. 14/597,787, filed on Jan. 15, 2015, now Pat. No. 9,595,344, which is a
(Continued)

(30) Foreign Application Priority Data

Dec. 13, 2007 (JP) .................. 2007-322415
Dec. 27, 2007 (JP) .................. 2007-338363

(51) Int. Cl.
*G11C 11/34* (2006.01)
*G11C 16/34* (2006.01)
(Continued)

(52) U.S. Cl.
CPC .......... *G11C 16/3445* (2013.01); *G11C 16/10* (2013.01); *G11C 16/14* (2013.01); *G11C 16/26* (2013.01)

(58) Field of Classification Search
CPC ...... G11C 16/16; G11C 16/14; G11C 16/3445
(Continued)

(56) References Cited

U.S. PATENT DOCUMENTS 6,381,670 B1 4/2002 Lee et al.
6,714,541 B1 3/2004 Iyer et al.
(Continued)

FOREIGN PATENT DOCUMENTS

JP 07-050096 2/1995
JP 08-190797 7/1996
(Continued)

OTHER PUBLICATIONS

Office Action dated May 22, 2012 in Japanese Application No. 2007-338363 (w/English translation).
(Continued)

*Primary Examiner* — Son Dinh
(74) *Attorney, Agent, or Firm* — Oblon, McClelland, Maier & Neustadt, L.L.P.

(57) ABSTRACT

In a memory cell array, a plurality of memory cells connected to a plurality of word lines and a plurality of bit lines are arranged in a matrix. A control circuit controls the potentials of said plurality of word lines and said plurality of bit lines. In an erase operation, the control circuit erases an n number of memory cells (n is a natural number equal to or larger than 2) of said plurality of memory cells at the same time using a first erase voltage, carries out a verify operation using a first verify level, finds the number of cells k (k≤n) exceeding the first verify level, determines a second erase voltage according to the number k, and carries out an erase operation again using the second erase voltage.

13 Claims, 25 Drawing Sheets

Related U.S. Application Data continuation of application No. 13/660,044, filed on Oct. 25, 2012, now Pat. No. 8,971,130, which is a continuation of application No. 13/162,051, filed on Jun. 16, 2011, now Pat. No. 8,335,114, which is a continuation of application No. 12/332,681, filed on Dec. 11, 2008, now Pat. No. 7,995,392.

(51) Int. Cl.
*G11C 16/14* (2006.01)
*G11C 16/26* (2006.01)
*G11C 16/10* (2006.01)

(58) Field of Classification Search
USPC ........................................ 365/185.29, 185.22
See application file for complete search history.

(56) References Cited

U.S. PATENT DOCUMENTS

| | | | |
|---|---|---|---|
| 6,903,981 B2 * | 6/2005 | Futatsuyama | G11C 16/16 365/185.11 |
| 6,996,024 B2 | 2/2006 | Tanzawa et al. | |
| 7,009,889 B2 | 3/2006 | Tran et al. | |
| 7,068,541 B2 | 6/2006 | Sakamoto et al. | |
| 7,099,194 B2 | 8/2006 | Tu et al. | |
| 7,233,522 B2 | 6/2007 | Chen et al. | |
| 7,233,529 B2 | 6/2007 | Matsubara et al. | |
| 7,315,472 B2 | 1/2008 | Lee | |
| 7,995,392 B2 * | 8/2011 | Shibata | G11C 16/3445 365/185.18 |
| 9,595,344 B2 * | 3/2017 | Shibata | G11C 16/14 |
| 2006/0221660 A1 * | 10/2006 | Hemink | G11C 11/5628 365/100 |
| 2006/0221709 A1 | 10/2006 | Hemink | |
| 2008/0159009 A1 | 7/2008 | Aritome | |

FOREIGN PATENT DOCUMENTS

| | | |
|---|---|---|
| JP | 08-306196 | 11/1996 |
| JP | 09-007383 | 1/1997 |
| JP | 10-011990 | 1/1998 |
| JP | 10-055691 | 2/1998 |
| JP | 10-228783 | 8/1998 |
| JP | 11-176175 | 7/1999 |
| JP | 11-273368 | 10/1999 |
| JP | 2000-285692 | 10/2000 |
| JP | 2001-283595 | 10/2001 |
| JP | 2002-25283 | 1/2002 |
| JP | 2002-157890 | 5/2002 |
| JP | 2002-216487 | 8/2002 |
| JP | 2002-358792 | 12/2002 |
| JP | 2002-367380 | 12/2002 |
| JP | 2003-068086 | 3/2003 |
| JP | 2003-257190 | 9/2003 |
| JP | 2004-192789 | 7/2004 |
| JP | 2004-206829 | 7/2004 |
| JP | 2005-025891 | 1/2005 |
| JP | 2005-100501 | 4/2005 |
| JP | 2005-327409 | 11/2005 |
| JP | 2006-500705 | 1/2006 |
| JP | 2006-216215 | 8/2006 |
| JP | 2006-228405 | 8/2006 |
| JP | 2006-528403 | 12/2006 |
| JP | 2007-80477 | 3/2007 |
| JP | 2007-184073 | 7/2007 |
| JP | 2007-523502 | 8/2007 |
| JP | 2007-272952 | 10/2007 |
| JP | 2007-323735 | 12/2007 |

OTHER PUBLICATIONS

Japanese Office Action dated May 7, 2013 in Patent Application No. 2012-161889 (w/English translation).
Office Action dated Oct. 15, 2013 in Japanese Patent Application No. 2012-161889 (w/English translation).

* cited by examiner

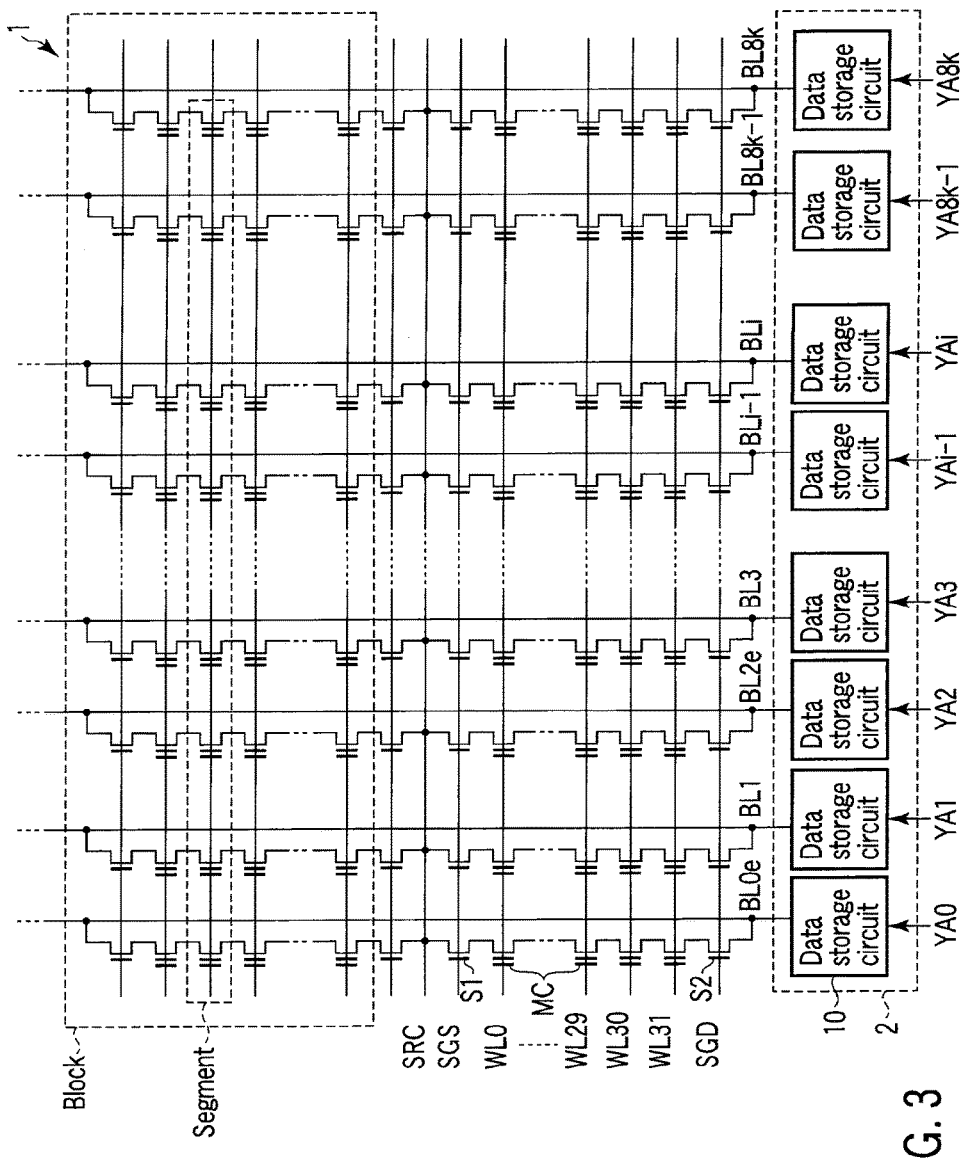
F I G. 3

|  | Cell(P-Well) | Cell(N-Well) | H.V.Tr(P-sub) | L.V.Nch(P-well) | L.V.Pch(N-well) | H.V.Pch(N-well) |
|---|---|---|---|---|---|---|
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vfix(1.6V) | Vfix(1.6V) | Vss(0V) | Vss(0V) | Vdd(2.5V) | Vdd(2.5V)/Vreadh+Vfix |

F I G. 6

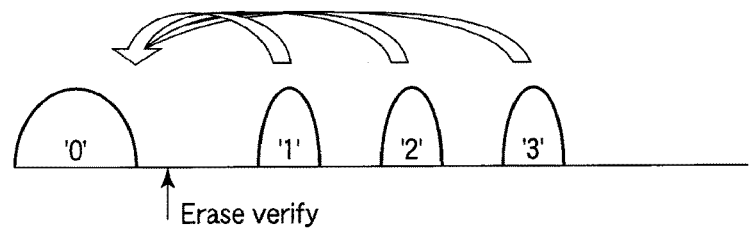
F I G. 13
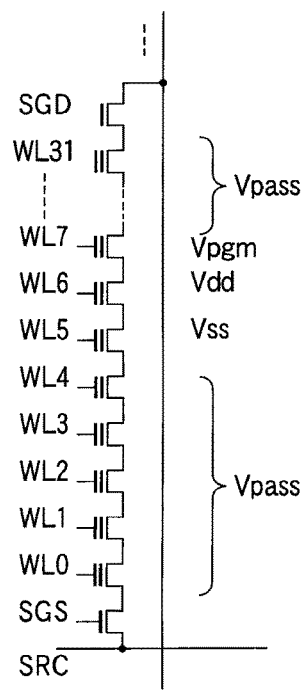
F I G. 17
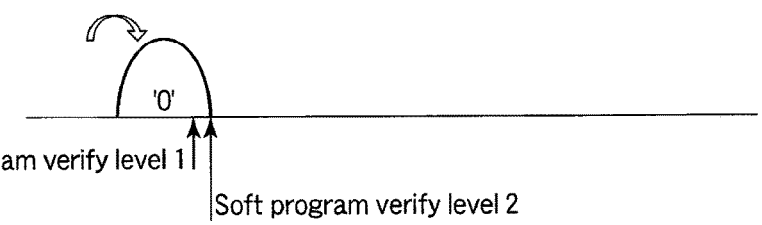
F I G. 18

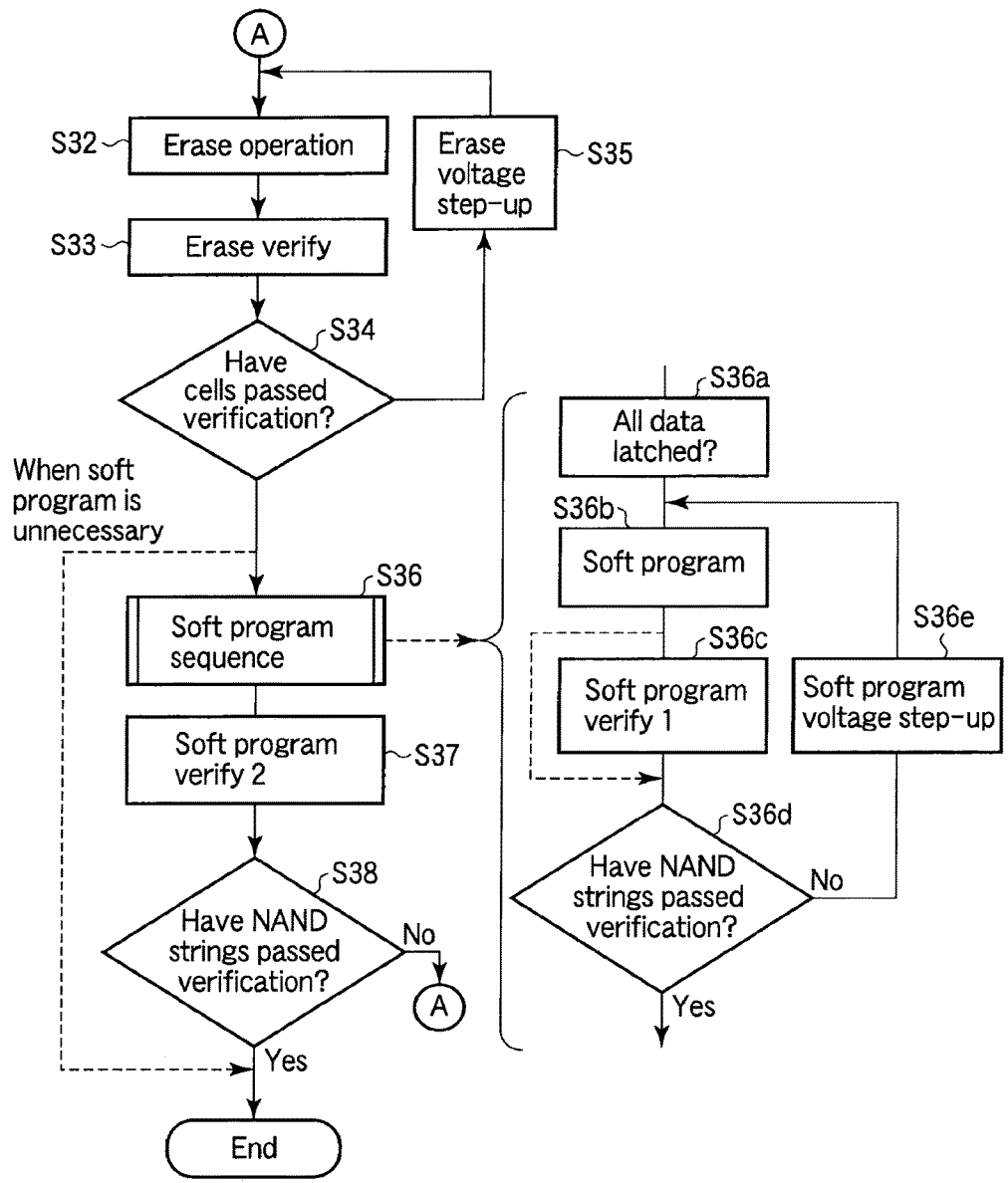
F I G. 14

F I G. 19A 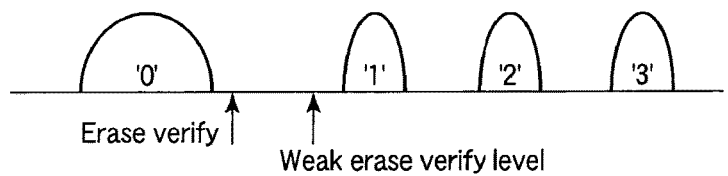
F I G. 19B 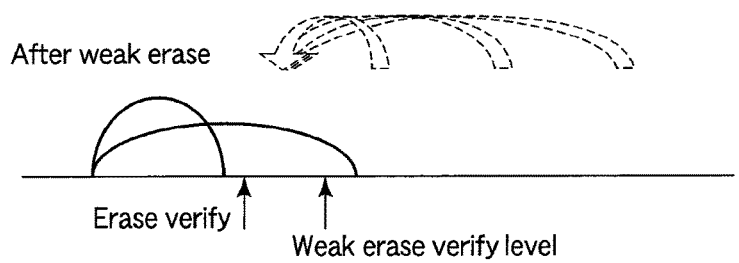
F I G. 19C 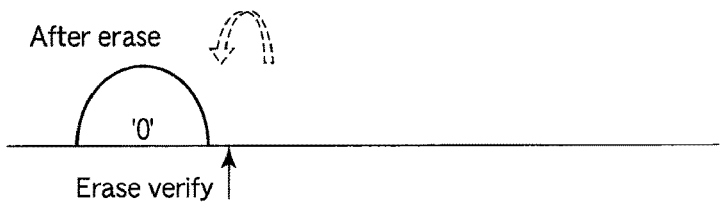

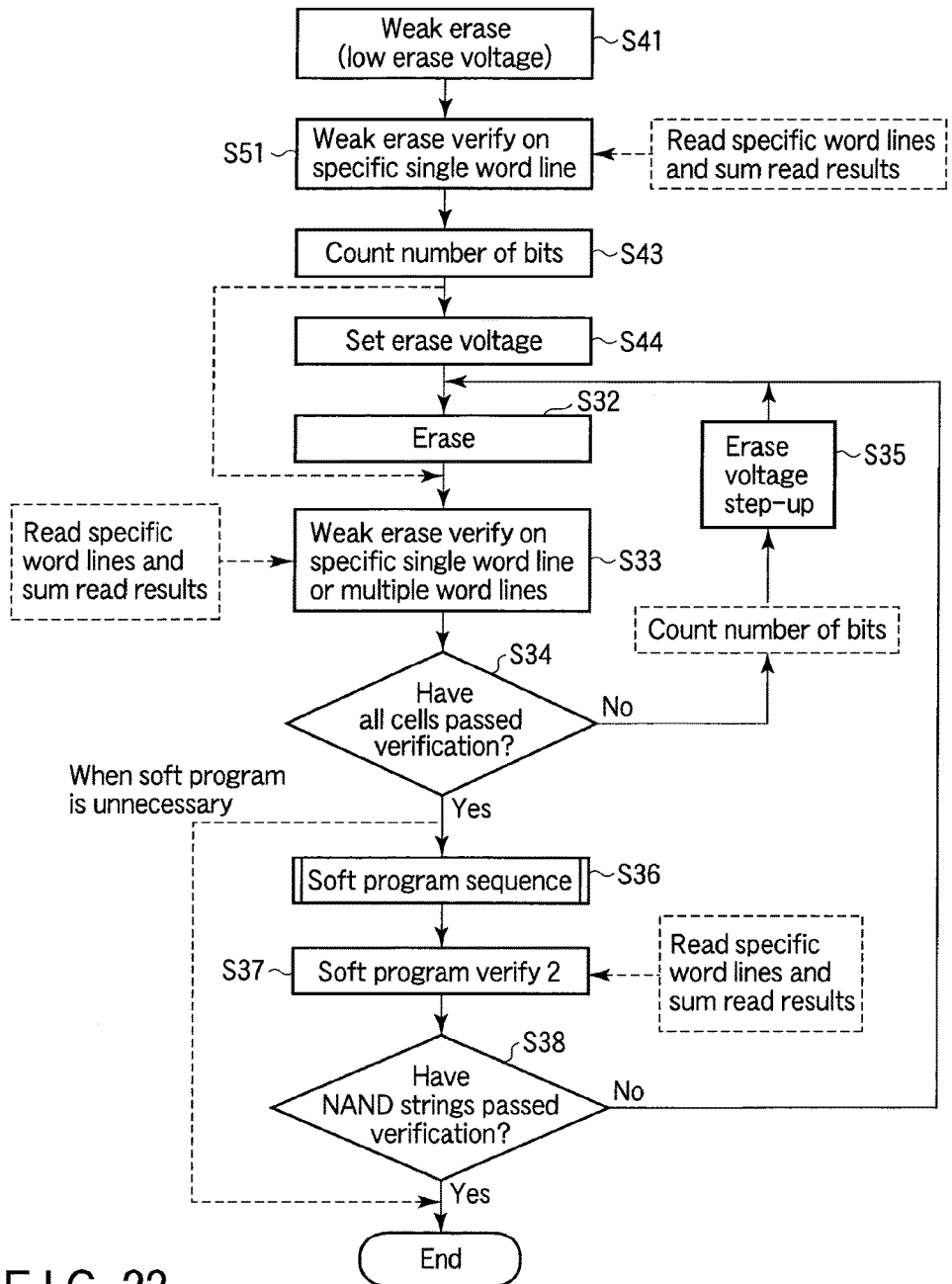
F I G. 22

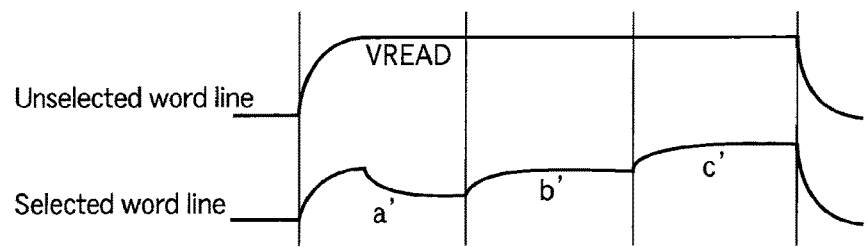
F I G. 27
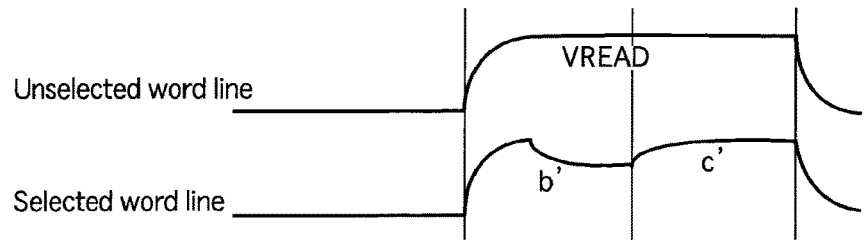
F I G. 28
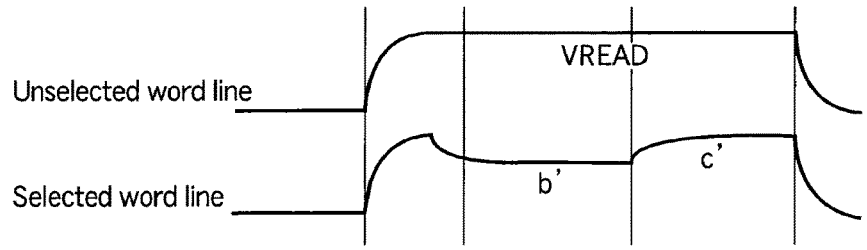
F I G. 29
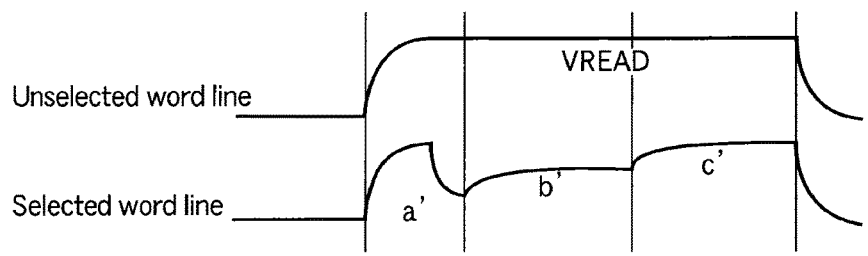
F I G. 30

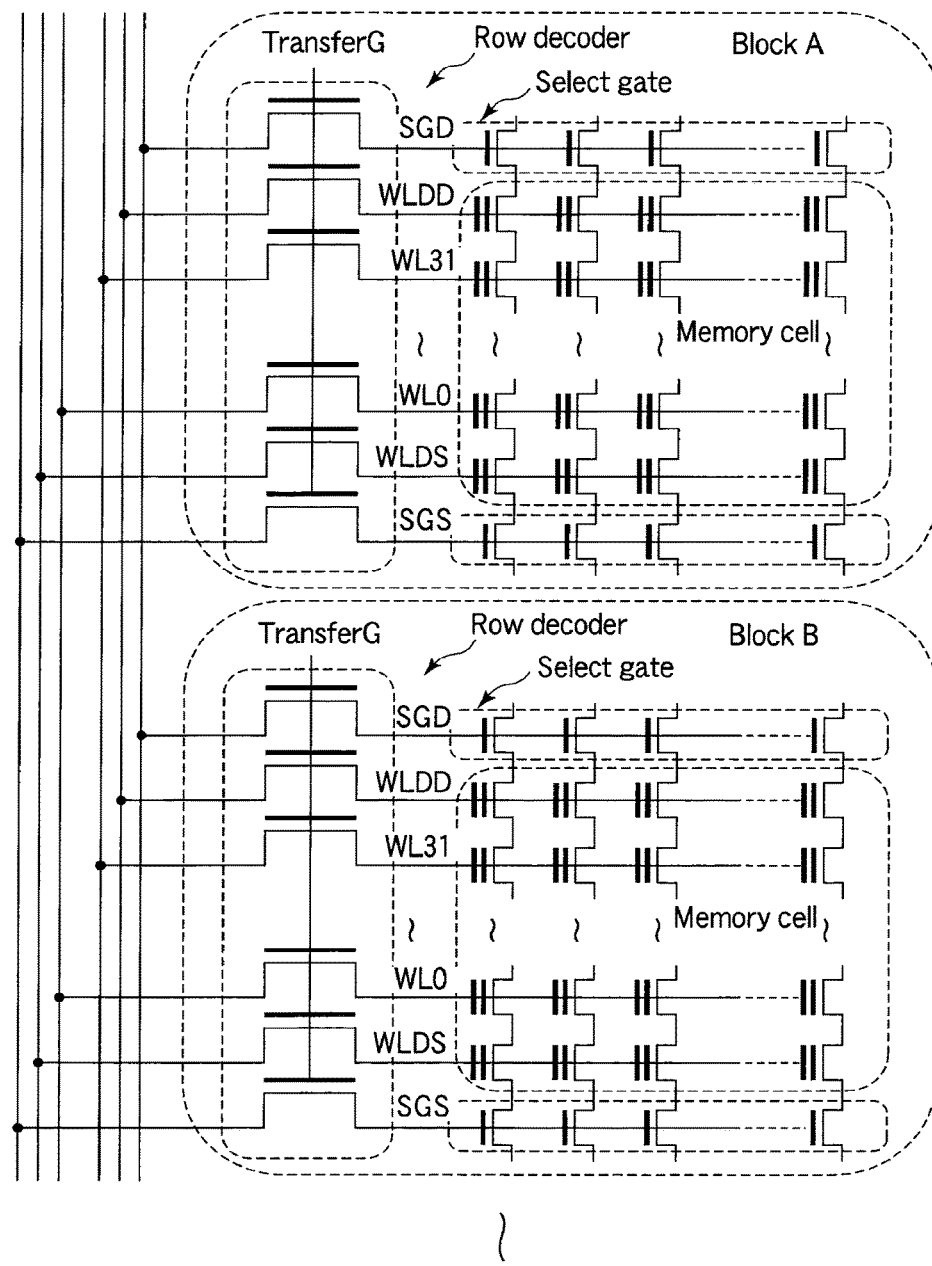
F I G. 31

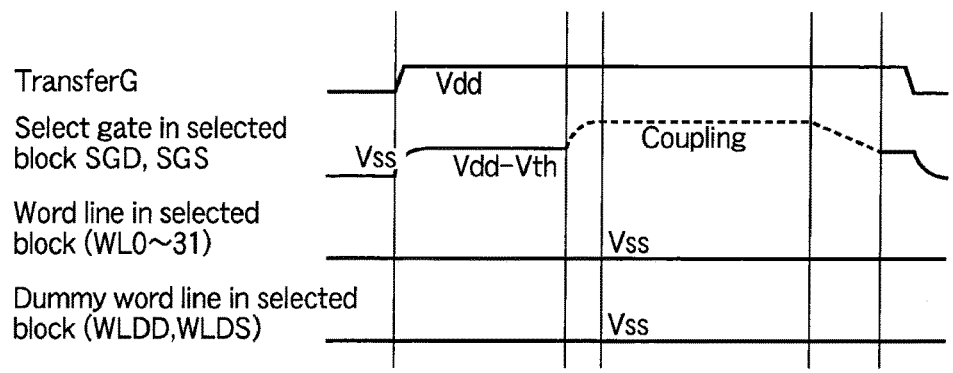
F I G. 32
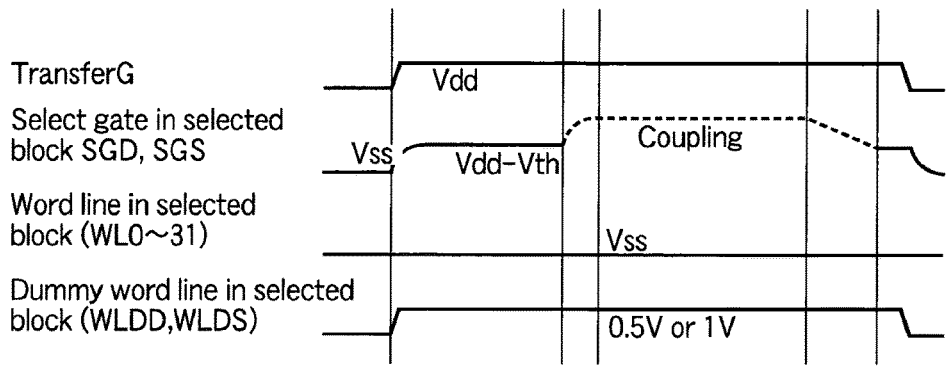
F I G. 33

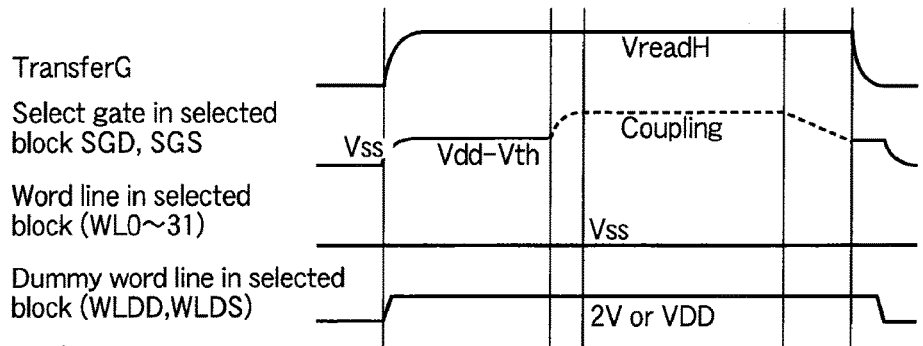
F I G. 34
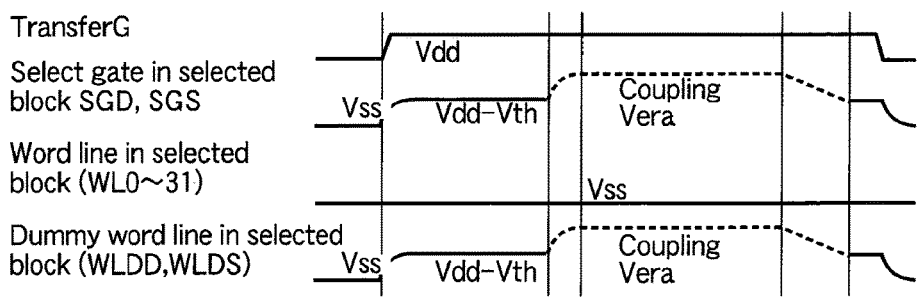
F I G. 35
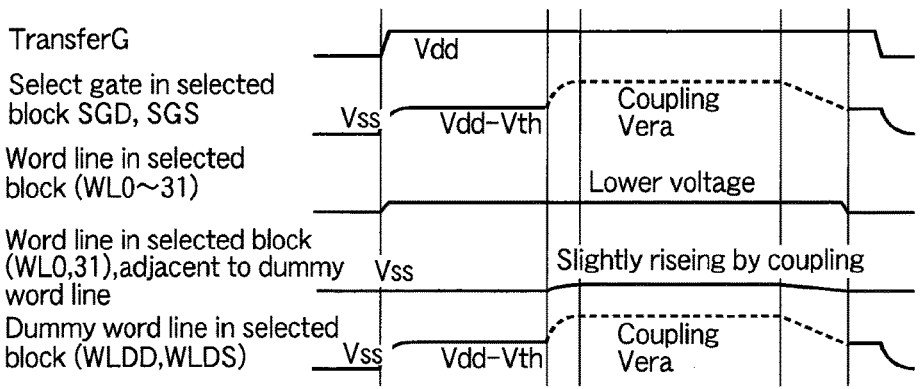
F I G. 36

SEMICONDUCTOR MEMORY DEVICE CAPABLE OF SHORTENING ERASE TIME

CROSS-REFERENCE TO RELATED APPLICATIONS

This application is a continuation of and claims the benefit of priority under 35 U.S.C. § 120 from U.S. Ser. No. 14/597,787 filed Jan. 15, 2015, which is a continuation of U.S. Ser. No. 13/660,044 filed Oct. 25, 2012 (now U.S. Pat. No. 8,971,130 issued Mar. 3, 2015), which is a continuation of U.S. Ser. No. 13/162,051 filed Jun. 16, 2011 (now U.S. Pat. No. 8,335,114 issued Dec. 18, 2012), which is a continuation of U.S. Ser. No. 12/332,681 filed Dec. 11, 2008 (now U.S. Pat. No. 7,995,392 issued Aug. 9, 2011), and claims the benefit of priority under 35 U.S.C. § 119 from Japanese Patent Applications No. 2007-322415 filed Dec. 13, 2007 and No. 2007-338363 filed Dec. 27, 2007, the entire contents of each of which are incorporated herein by reference.

BACKGROUND OF THE INVENTION

1. Field of the Invention

This invention relates to a semiconductor memory device capable of storing a plurality of data items in a single memory cell.

2. Description of the Related Art

A NAND flash memory has been developed as a nonvolatile semiconductor memory device. In a NAND flash memory, all of or half of the cells arranged in the row direction are connected to bit lines in a one-to-one correspondence. Each bit line is connected to a latch circuit which stores write data and read data. All of or half of the cells (e.g., 2 to 4 KB of cells) arranged in the row direction are written to or read from simultaneously. In an erase operation, the threshold voltage of a memory cell is made negative and electrons are injected into the memory cell by a write operation, thereby making the threshold voltage positive. The erase operation is carried out in blocks, each block (e.g., 1 MB of cells) including a plurality of NAND strings (e.g., refer to Jpn. Pat. Appln. KOKAI Publication No. 2004-192789).

If a memory cell has been erased deeply in an erase operation and the threshold voltage of the memory cell is made negative strongly, great stress is placed on the cell, which causes the cell to deteriorate further. This causes a problem: the data retention characteristic gets worse. Therefore, the cell has to be erased as shallowly as possible. However, if the erase voltage is made lower, the following problem arises: when a NAND flash memory is written to and erased repeatedly, it is erased less easily. To avoid this problem, there is a method of, when erasing the NAND flash memory shallowly, making the erase voltage lower and stepping up the erase voltage gradually, thereby erasing the memory gradually. In this case, however, the following problems arise: the erase time increases and stress is placed on the cells because erase pulses are applied to the cells many times.

To overcome this problem, the following technique has been developed: the number of erased cells in a cell erase verify operation is checked and, if the number of erased cells is smaller than a predetermined number, the erase pulse width or erase voltage is increased and erasing is done, and if the number of erased cells is larger than the predetermined number, the erase pulse width or erase voltage is decreased and erasing is done, thereby keeping constant the erase speed varying according to the process or operating environment to prevent excessive erasure (e.g., refer to Jpn. Pat. Appln. KOKAI Publication No. 2002-25283).

Furthermore, since an erase verify operation is carried out on a NAND string basis, its verify accuracy is lower than when reading is done on a one-word line basis. To overcome this problem, a nonvolatile semiconductor memory device capable of shortening erase time and assuring high reliability has been developed (e.g., refer to Jpn. Pat. Appln. KOKAI Publication No. 2002-157890).

However, those are not sufficient and a still shorter erase time and a still higher erase verify accuracy have been desired.

BRIEF SUMMARY OF THE INVENTION

According to a first aspect of the invention, there is provided a semiconductor memory device comprising: a memory cell array in which a plurality of memory cells connected to a plurality of word lines and a plurality of bit lines are arranged in a matrix; and a control circuit which controls the potentials of said plurality of word lines and said plurality of bit lines and which, in an erase operation, erases an n number of memory cells (n is a natural number equal to or larger than 2) of said plurality of memory cells at the same time using a first erase voltage, carries out a verify operation at a first verify level, finds the number of cells k ($k \leq n$) (k is a natural number equal to or larger than 1) exceeding the first verify level, determines a second erase voltage according to the number k, and carries out a second erase operation using the second erase voltage.

According to a second aspect of the invention, there is provided a semiconductor memory device comprising: a memory cell array in which a plurality of memory cells connected to a plurality of word lines and a plurality of bit lines are arranged in a matrix; and a control circuit which controls the potentials of said plurality of word lines and said plurality of bit lines and which, in an erase operation, erases said plurality of memory cells simultaneously, and verifies the threshold voltage of a memory cell selected by a specific one of the word lines using a first verify level, the first verify level being offset by a second verify level in verifying all the word line simultaneously.

According to a third aspect of the invention, there is provided a semiconductor memory device comprising: a memory cell array in which a plurality of memory cells connected to a plurality of word lines and a plurality of bit lines are arranged in a matrix; and a control circuit which controls the potentials of said plurality of word lines and said plurality of bit lines, wherein, in an erase operation, the control circuit erases said plurality of memory cells connected to n word lines of the plurality of word lines simultaneously, and carries out a verify operation to determine whether the threshold voltage of a memory cell selected by a specific word line of the n word lines has reached a threshold level in the erase operation using a first verify level.

According to a fourth aspect of the invention, there is provided a semiconductor memory device comprising: a memory cell array in which a plurality of memory cells connected to a plurality of word lines and a plurality of bit lines are arranged in a matrix; and a control circuit which controls the potentials of said plurality of word lines and said plurality of bit lines, wherein, in an erase operation, the control circuit erases said plurality of memory cells connected to n word lines of the plurality of word lines simultaneously and then performs a write operation on said plurality of memory cells connected to the n word lines simultaneously, and carries out a verify operation to determine whether the threshold voltage of a memory cell selected by a specific word line of the n word lines has reached a threshold level using a first verify level.

BRIEF DESCRIPTION OF THE SEVERAL VIEWS OF THE DRAWING

FIG. 3 is a circuit diagram of another example of the memory cell array and bit line control circuit shown in FIG. 1;

FIG. 6 is a table listing an example of voltages supplied to various parts shown in FIG. 5;

FIG. 13 shows changes in the threshold voltage of a memory cell in an erase operation;

FIG. 14 is a flowchart to explain an example of an erase operation;

FIG. 17 is a diagram to explain an Erased Area Self Boost (EASB) method;

FIG. 18 shows a verify level in a soft program operation;

FIGS. 19A, 19B, and 19C show changes in the threshold voltage of a memory cell in a weak erase operation;

FIG. 22 is a flowchart to explain a weak erase operation according to a second embodiment of the invention;

FIG. 27 shows the potential of a word line in a read operation and a verify read operation;

FIG. 28 shows the potential of a word line in a verify read operation;

FIG. 29 shows the potential of a word line when a verify operation is omitted;

FIG. 30 illustrates a modification of FIG. 29 and shows the potential of a word line in case a verify operation is omitted;

FIG. 31 is a circuit diagram of examples of the memory cell array and row decoder shown in FIGS. 2 and 3;

FIG. 32 shows the potential of each portion in case an erase operation is performed for a dummy cell;

FIG. 33 shows the potentials of word lines WLDD and WLDS of dummy cells in an erase operation;

FIG. 34 shows the potential of a signal supplied to the gate of a transistor used for selecting a row decoder of a selected block;

FIG. 35 shows a potential supplied to the gate of a transistor used for selecting a row decoder of a selected block; and FIG. 36 shows a potential supplied to the word lines adjacent to dummy word lines WLDD and WLDS.

DETAILED DESCRIPTION OF THE INVENTION

Hereinafter, referring to the accompanying drawings, embodiments of the invention will be explained.

Figure 1:
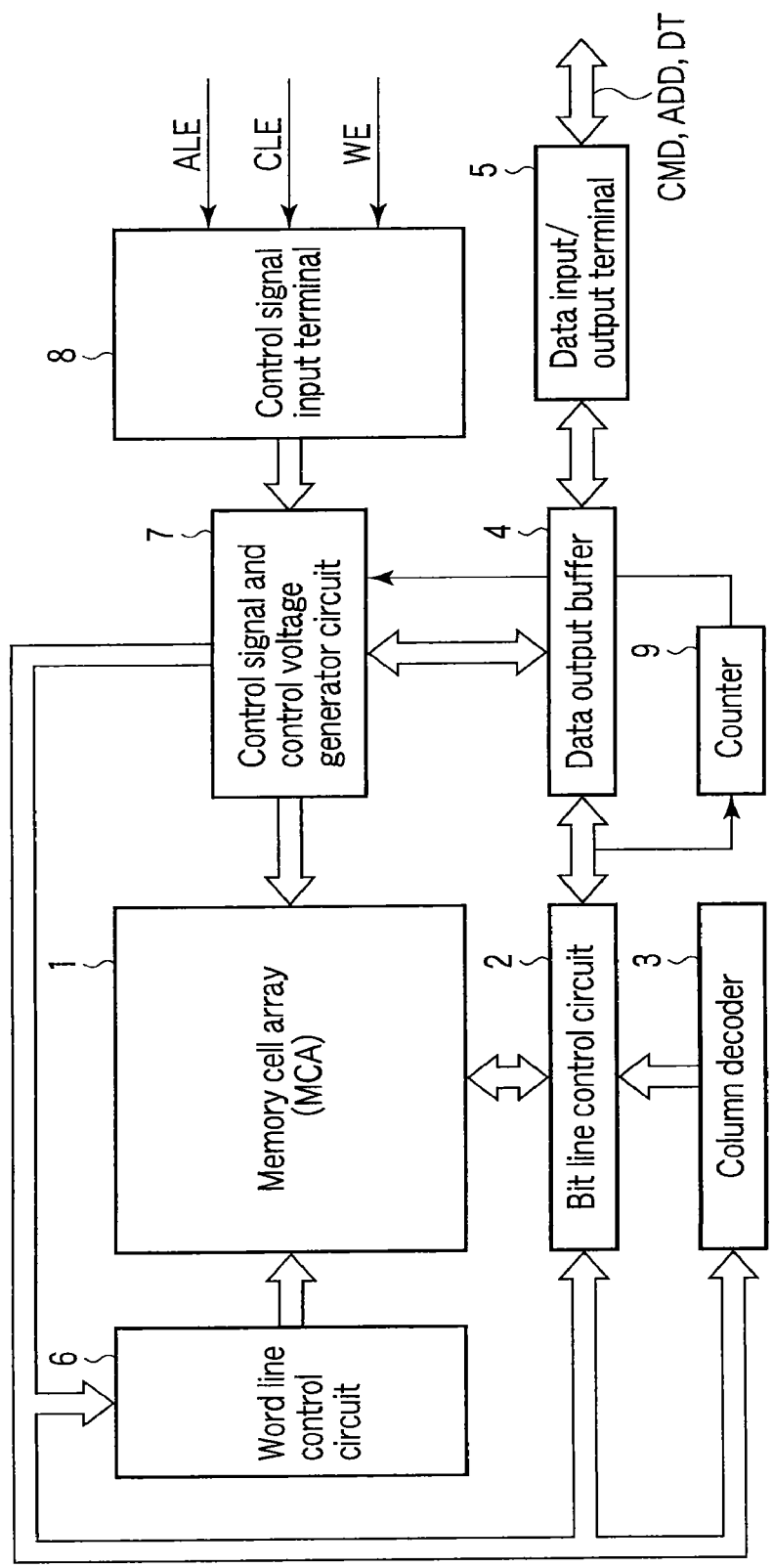
FIG. 1 shows the configuration of a semiconductor memory device applied to each embodiment of the invention.

FIG. 1 shows a configuration of a semiconductor memory device, such as a NAND flash memory capable of storing 4 levels (2 bits), applied to each embodiment of the invention.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data to a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal 5 is connected to, for example, a host (not shown) outside the memory chip. The host, which is composed of, for example, a microcomputer, receives the data output from the data input/output terminal 5. The host outputs various commands CMD for controlling the operation of the NAND flash memory, addresses ADD, and data DT. The write data input to the data input/output terminal 5 from the host is supplied via the data input/output buffer 4 to the data storage circuit selected by the column decoder 3. The commands and addresses are supplied to a control signal and control voltage generator circuit 7.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by the control signal and control voltage generator circuit 7. The control signal and control voltage generator circuit 7 is connected to a control signal input terminal 8 and is controlled by Address Latch Enable (ALE), Command Latch Enable (CLE), Write Enable (WE), and Read Enable (RE) control signals input from the host via the control signal input terminal 8.

The bit line control circuit 2, column decoder 3, word line control circuit 6, and control signal and control voltage generator circuit 7 constitute a write circuit and a read circuit.

A counter 9 is connected to the output end of the bit line control circuit 2. The counter 9 is for counting the number of memory cells not erased from in an erase operation as described later. The output signal of the counter 9 is supplied to the control signal and control voltage generator circuit 7. The control signal and control voltage generator circuit 7 varies an erase voltage according to the output of the counter 9.

Figure 2:
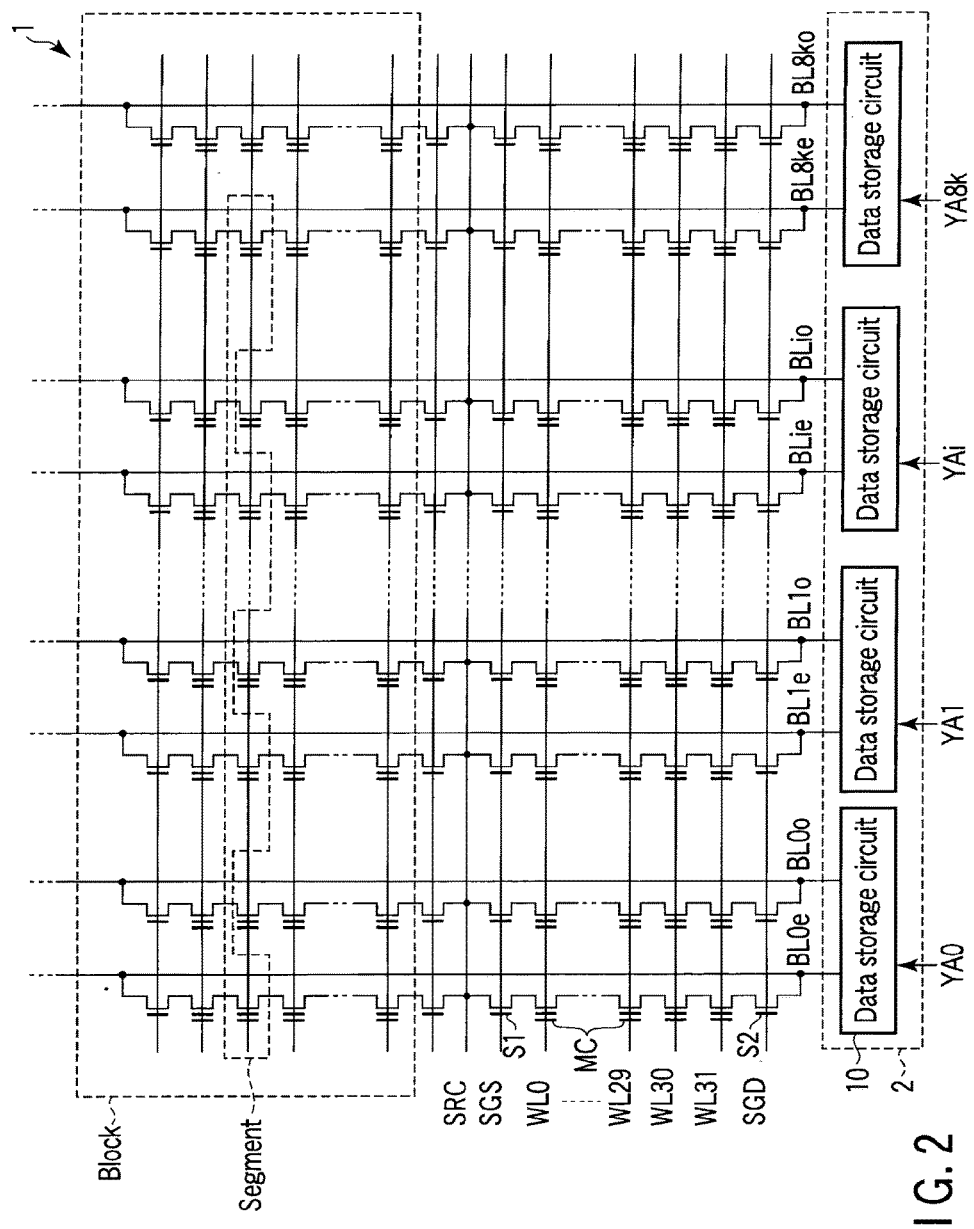
FIG. 2 is a circuit diagram of an example of the memory cell array and bit line control circuit shown in FIG. 1.

FIG. 2 shows a configuration of the memory cell array 1 and bit line control circuit 2 shown in FIG. 1. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0e and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Bit line pairs (BL0e, BL0o), (BL1e, BL1o), ..., (BLie, BLio), (BL8ke, BL8ko) are connected to the individual data storage circuits 10 in a one-to-one correspondence.

The memory cell array 1 includes a plurality of blocks as shown by a broken line. Each block is composed of a plurality of NAND cells. In the memory cell array 1, data is erased in, for example, blocks. An erase operation is performed simultaneously on the two bit lines connected to the data storage circuit 10.

A plurality of memory cells which are arranged every other bit line and are connected to a single word line (or the memory cells enclosed by a broken line) constitute one segment. Data is written or read in segments.

In a read operation, a program verify operation, and a program operation, one of the two bit lines (BLie, BLio) connected to the data storage circuit 10 is selected according to the address signals (YA0, YA1, ..., YAi, ..., YA8k) externally supplied. Moreover, according to an external address, a single word line is selected.

Furthermore, a single word line is selected according to an external address, with the result that two pages enclosed by a dotted line in FIG. 2 are selected. Switching between two pages is done by an address. When 2 bits are stored in one cell, two pages are selected; when 3 bits are stored in one cell, three pages are selected; and when 4 bits are stored in one cell, four pages are selected. An erase operation is carried out using a block unit shown by the dotted line in FIG. 2.

FIG. 3 shows a configuration when all the cell arranged in the row direction are written to simultaneously. In this case, the individual bit lines BL0, BL1, ..., BL8k-1, BL8k are connected to the data storage circuits 10 in a one-to-one correspondence. Address signals YA0, YA1, ..., YA8k-1, YA8k are supplied to the individual data storage circuits 10 in a one-to-one correspondence.

Figures 4A, 4B:
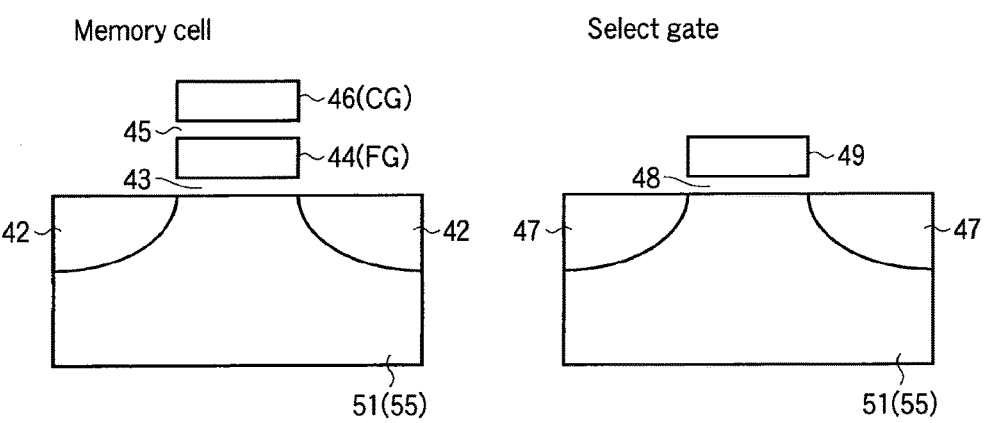
FIG. 4A is a sectional view of a memory cell and FIG. 4B is a sectional view of a select gate.

FIGS. 4A and 4B show a sectional view of a memory cell and that of a select gate, respectively. In FIG. 4A, an n-type diffused layer 42 acting as the source and drain of a memory cell is formed in a substrate 51 (or a p-well region 55 described later). Above the p-well region 55, a floating gate (FG) 44 is formed via a gate insulating film 43. Above the floating gate 44, a control gate (CG) 46 is formed via an insulating film 45. In FIG. 4B, an n-type diffused layer 47 acting as a source and a drain is formed in the p-well region 55. Above the p-well well region 55, a control gate 49 is formed via a gate insulating film 48.

Figure 5:
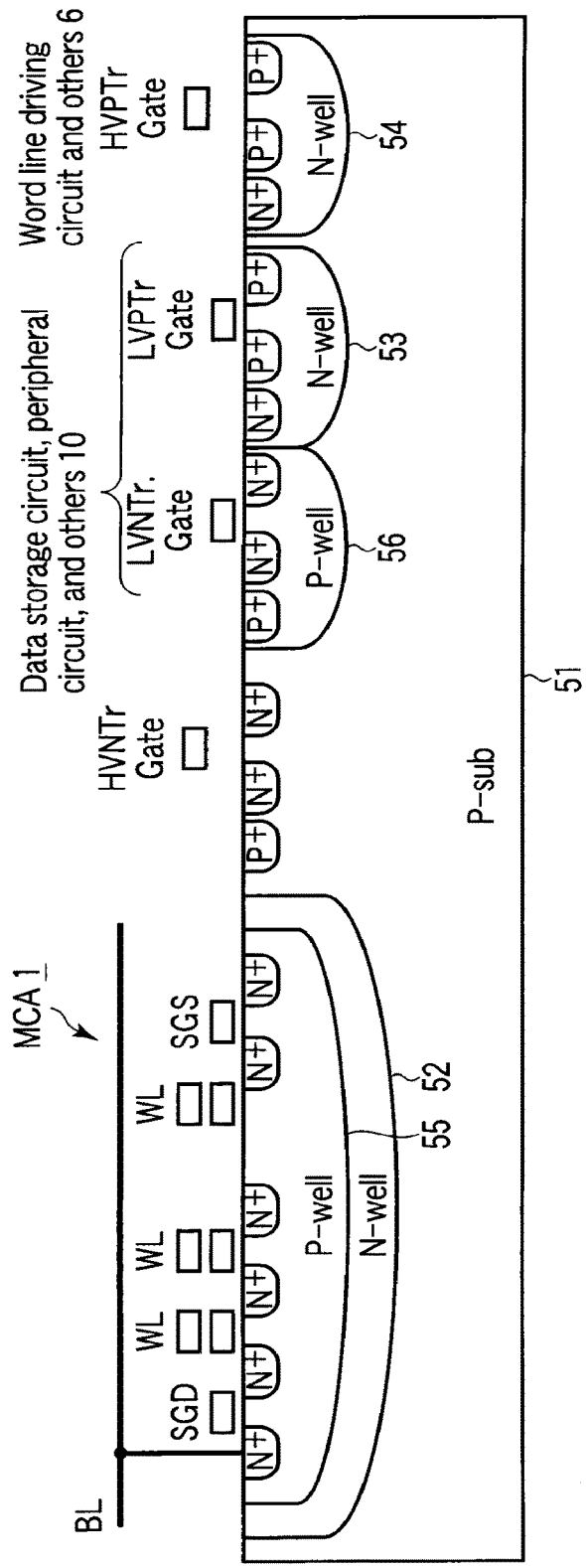
FIG. 5 is a sectional view of the memory cell array and peripheral circuit.

FIG. 5 is a sectional view of a semiconductor memory device according to the first embodiment. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 5, the high-voltage transistors HVNTr, HVPTr have, for example, a thicker gate insulating film than that of the low-voltage transistors LVNTr, LVPTr.

FIG. 6 is a table listing examples of the voltages supplied to various regions in FIG. 5 in erasing, programming, and reading a memory cell.

Figure 7:
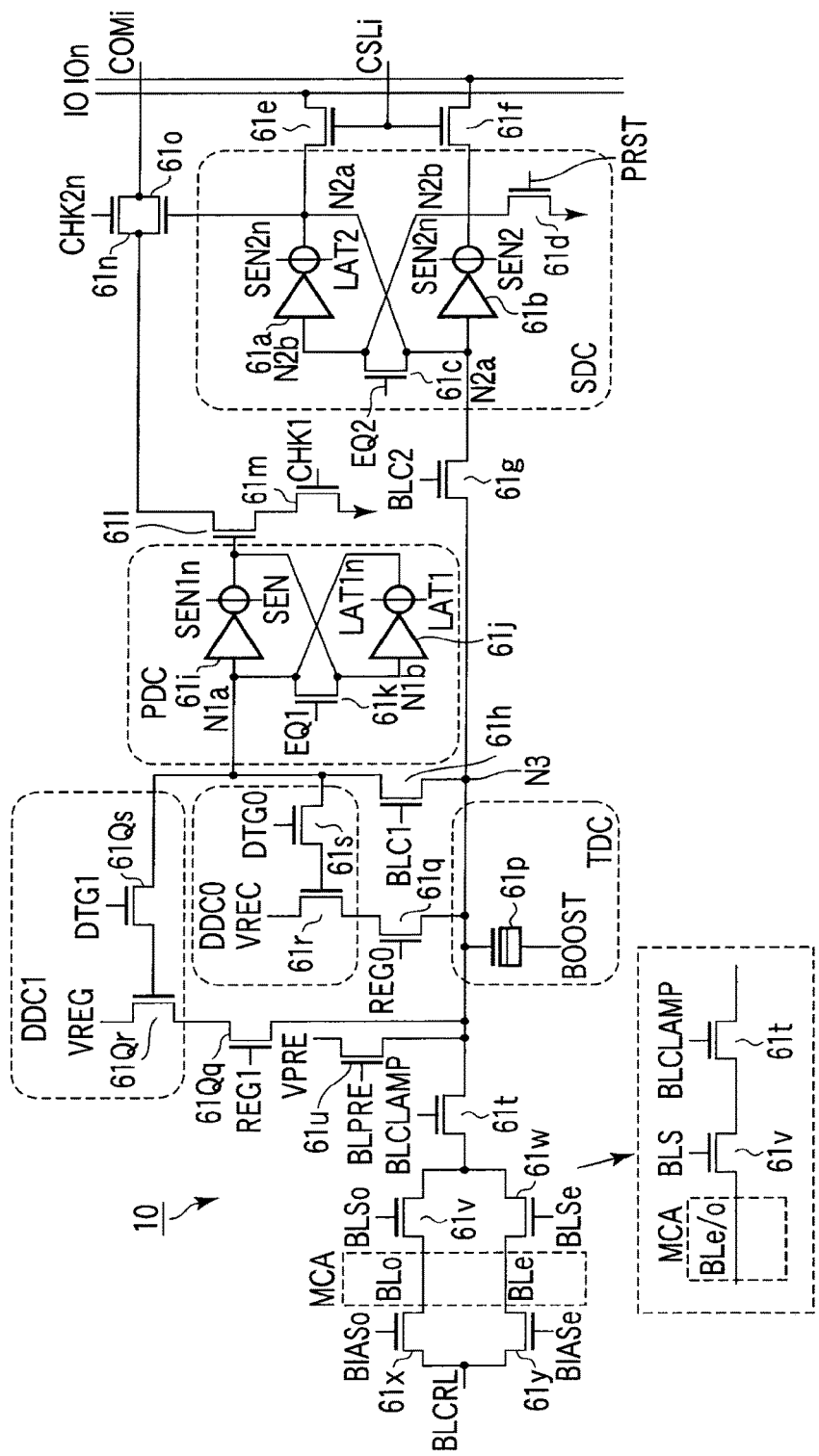
FIG. 7 is a circuit diagram of an example of the data storage circuit shown in FIGS. 2 and 3.

FIG. 7 is a circuit diagram of an example of the data storage circuit 10 shown in FIGS. 2 and 3.

The data storage circuit 10 includes a primary data cache (PDC), a secondary data cache (SDC), a dynamic data cache (DDC0), a dynamic data cache Q (DDC1), and a temporary data cache (TDC). The SDC, PDC, and DDC0 hold input data in a write operation, hold read data in a read operation, temporarily hold data in a verify operation, and are used to manipulate internal data in storing multilevel data. The TDC not only amplifies data on a bit line in reading data and temporarily holds the data, but also is used to manipulate internal data in storing multilevel data.

The SDC is composed of clocked inverter circuits 61a, 61b constituting a latch circuit and transistors 61c, 61d. The transistor 61c is connected between the input end of the clocked inverter circuit 61a and the input end of the clocked inverter circuit 61b. A signal EQ2 is supplied to the gate of the transistor 61c. The transistor 61d is connected between the output end of the clocked inverter circuit 61b and the ground. A signal PRST is supplied to the gate of the transistor 61d. Node N2a of the SDC is connected via a column select transistor 61e to an input/output data line TO. Node N2b of the SDC is connected via a column select transistor 61f to an input/output data line IOn. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input end of the clocked inverter circuit 61i and the input end of the clocked inverter circuit 61j. A signal EQ1 is supplied to the gate of the transistor 61k. Node N1b of the PDC is connected to the gate of the transistor 61l. One end of the current path of the transistor 61*l* is connected to the ground via a transistor 61*m*. A signal CHK1 is supplied to the gate of the transistor 61*m*. The other end of the current path of the transistor 61*l* is connected to one end of the current path of transistors 61*n*, 61*o* constituting a transfer gate. A signal CHK2*n* is supplied to the gate of the transistor 61*n*. The gate of the transistor 61*o* is connected to the output end of the clocked inverter circuit 61*a*. The other end of the current path of the transistors 61*n*, 61*o* is connected to a wiring line COMi. The wiring line COMi is connected equally to all of the data storage circuits 10. When the verification of all the data storage circuits 10 has been completed, the potential of the wiring line COMi goes high. Specifically, as described later, if the verification has been completed, node N1*b* of the PDC goes low. In this state, when the signals CHK1, CHK2*n* are made high, if the verification has been completed, the wiring line COMi goes high.

Furthermore, the TDC is composed of, for example, a MOS capacitor 61*p*. One end of the capacitor 61*p* is connected to a junction node N3 of the transistors 61*g*, 61*h*. A signal BOOST is supplied to the other end of the capacitor 61*p*. The DDC0 is supplied via a transistor 61*q* to the junction node N3. A signal REG0 is supplied to the gate of the transistor 61*q*.

The DDC0 is composed of transistors 61*r*, 61*s*. A signal VREG is supplied to one end of the current path of the transistor 61*r*. The other end of the transistor 61*r* is connected to the current path of the transistor 61*q*. The gate of the transistor 61*r* is connected to node N1*a* of the PDC via a transistor 61*s*. A signal DTG0 is supplied to the gate of the transistor 61*s*.

The DDC1 is composed of transistors 61Q*r*, 61Q*s*. A signal VREG is supplied to one end of the current path of a transistor 61Q*r*. The other end of the current path of the transistor 61Q*r* is connected to a junction node N3 via the transistor 61Q*q*. A signal REG1 is supplied to the gate of the transistor 61Q*q*. The gate of the transistor 61Q*r* is connected to node N1*a* of the PDC via the transistor 61Q*s*. A signal DTG1 is supplied to the gate of the transistor 61Q*s*.

Furthermore, one end of the current path of each of transistors 61*t*, 61*u* is connected to the junction node N3. A signal VPRE is supplied to the other end of the current path of the transistor 61*u*. A signal BLPRE is supplied to the gate of the transistor 61*u*. A signal BLCLAMP is supplied to the gate of a transistor 61*t*. The other end of the current path of the transistor 61*t* is connected not only via a transistor 61*v* to one end of bit line BLo but also via a transistor 61*w* to one end of bit line BLe. The other end of bit line BLo is connected to one end of the current path of a transistor 61*x*. A signal BIASo is supplied to the gate of the transistor 61*x*. The other end of bit line BLe is connected to one end of the current path of a transistor 61*y*. A signal BIASe is supplied to the gate of the transistor 61*y*. A signal BLCRL is supplied to the other ends of the current paths of these transistors 61*x*, 61*y*. The transistors 61*x*, 61*y* are turned on according to signals BIASo, BIASe so as to be complementary to the transistors 61*v*, 61*w*, thereby supplying the potential of the signal BLCRL to the unselected bit lines.

The above-described signals and voltages are generated by the control signal and control voltage generator circuit 7 of FIG. 1. The operations below are controlled by the control signal and control voltage generator circuit 7.

The data storage circuit 10 of FIG. 3 has the same configuration as that of FIG. 7, except for the connection with the bit lines. Specifically, as shown in FIG. 7, for example, only the transistor 61*v* is connected to the other end of the transistor 61*t*, which is connected to bit line BLe or BLo via the transistor 61*v*.

The memory, which is a multilevel memory, can store 2 bits of data in a cell. Switching between 2 bits is done using an address (first page, second page). When 2 bits are stored in a single cell, there are two pages. When 3 bits are stored in a single cell, switching between 3 bits is done using an address (first page, second page, third page). When 4 bits are stored in a single cell, switching is done using an address (first page, second page, third page, fourth page).

Figure 8:
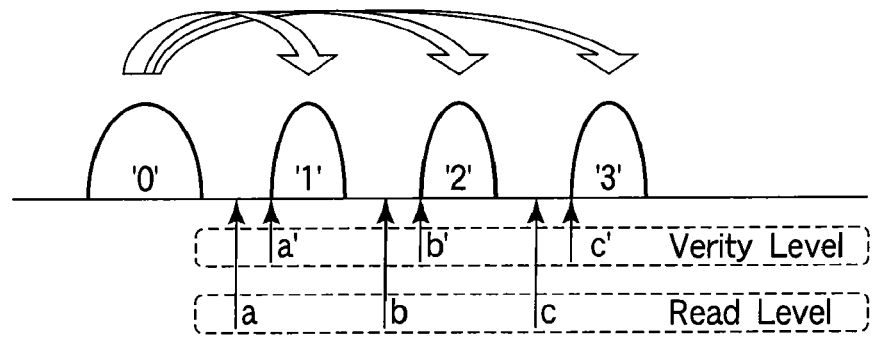
FIG. 8 shows an example of the threshold voltages of a memory cell after data has been written.

FIG. 8 shows the relationship between the data in a memory cell and the threshold voltages of the memory cell. Hereinafter, a case where four levels, or two bits, are stored in a cell will be explained. After an erase operation is carried out, the data in the memory cell is "0." When a first page and a second page have been written to, the data in the memory cell become data "0," "1," "2," and "3." In the embodiments, the data in the memory cell is defined in ascending order of threshold voltage.

(Read Operation)

As shown in FIG. 8, after data is written, the data in the memory cell is any one of "0," "1," "2," and "3." Therefore, the data can be read by carrying out a read operation at level "a," level "b," and level "c."

Figure 9:
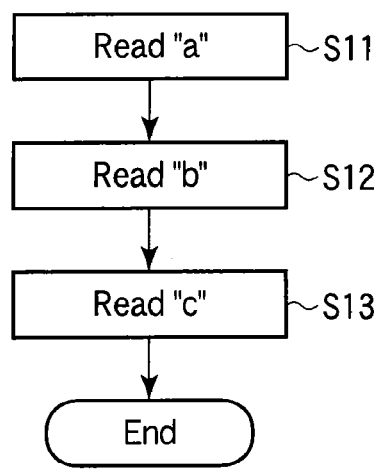
FIG. 9 is a flowchart to explain an example of a read operation.

FIG. 9 is a flowchart of a read sequence. First, reading is done at read level "a" (S11). Thereafter, reading is done at read level "b" (S12). In addition, reading is done at read level "c" (S13). By these operations, 2 bits of data can be read from the cell.

Figure 10:
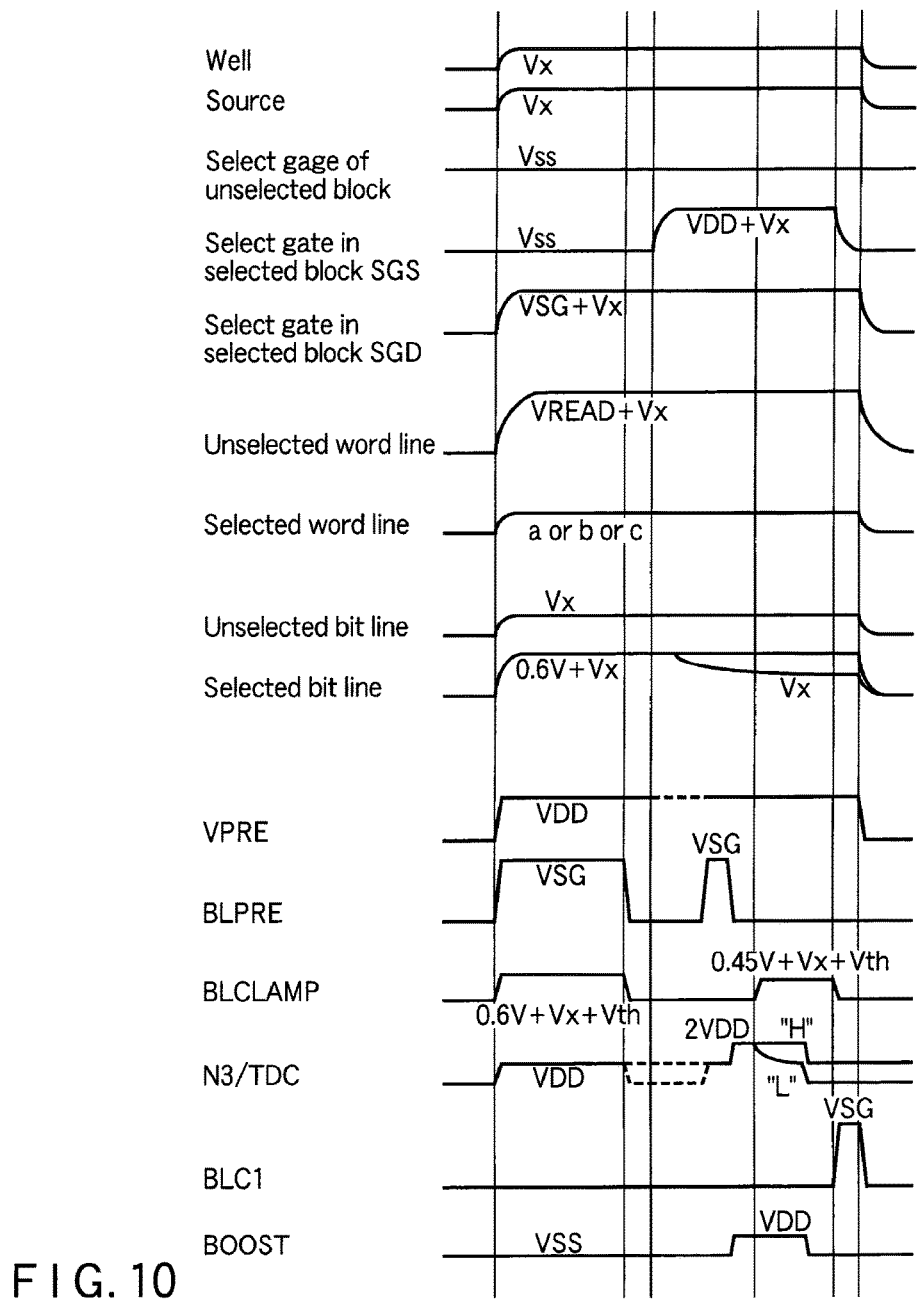
FIG. 10 is a timing chart to explain an example of a read operation.

FIG. 10 shows operating waveforms in a read operation and a read verify operation. Using FIG. 10, a read operation will be explained. First, at the same time that the well of the selected cell, the source line, and the unselected bit lines are set to voltage Vx, potential "a," "b," or "c" (e.g., "a"=0V) in a read operation is supplied to the selected word line, Vread+Vx is supplied to the unselected word lines of the selected block, Vsg(Vdd+Vth)+Vx is supplied to the select line SGD of the selected block, and Vss is supplied to the select line SGS. Here, Vdd is a power supply voltage, Vth is the threshold voltage of an n-channel MOS transistor, and Vx is a specific voltage. In the data storage circuit of FIG. 7, Vdd (e.g., 2.5V) is applied temporarily to Vpre, Vsg (=Vdd+Vth) to BLPRE, and a voltage of, for example, (0.6V+Vth+Vth) to signal BLCLAMP, thereby recharging the bit line to, for example (0.6V+Vx). Next, the select line SGS on the source side of the cell is set to Vdd+Vx. If the threshold voltage of the memory cell is higher than "a", "b," or "c" (e.g., "a"=0V), the cell goes off. Therefore, the bit line remains high (e.g., 1.6V). If the threshold voltage of the memory cell is lower than "a", "b," or "c", the cell goes on. Accordingly, the bit line is discharged and has the same potential as the source line, that is, the ground potential Vx.

Here, after signal BLPRE in the data storage circuit 10 of FIG. 7 is set temporarily to Vsg (=Vdd+Vth) and node N3 of the TDC is precharged to a power supply voltage Vdd, signal BOOST is changed from the ground potential Vss to Vdd, which sets node N3 of the TDC to 2Vdd. Next, for example, a voltage of (0.45V+Vth+Vx) is applied to signal BLCLAMP. If the potential of the bit line is lower than 0.45V+Vx, node N3 of the TDC goes low. If the potential of the bit line is higher than 0.45V+Vx, node N3 of the TDC remains high. After BLCLAMP is set to VSS to turn off transistor 61*t*, signal BOOST is changed from Vdd to Vss and then signal BLC1 is set to Vsg (=Vdd+Vth), thereby reading the potential of the TDC into the PDC. If the threshold voltage of the cell is lower than level "a," level "b," and level "c," the PDC goes low. If the threshold voltage of the cell is higher than level "a," level "b," and level "c," the PDC goes high and the data in the PDC is read.

(Program and Program Verify)

Figure 11:
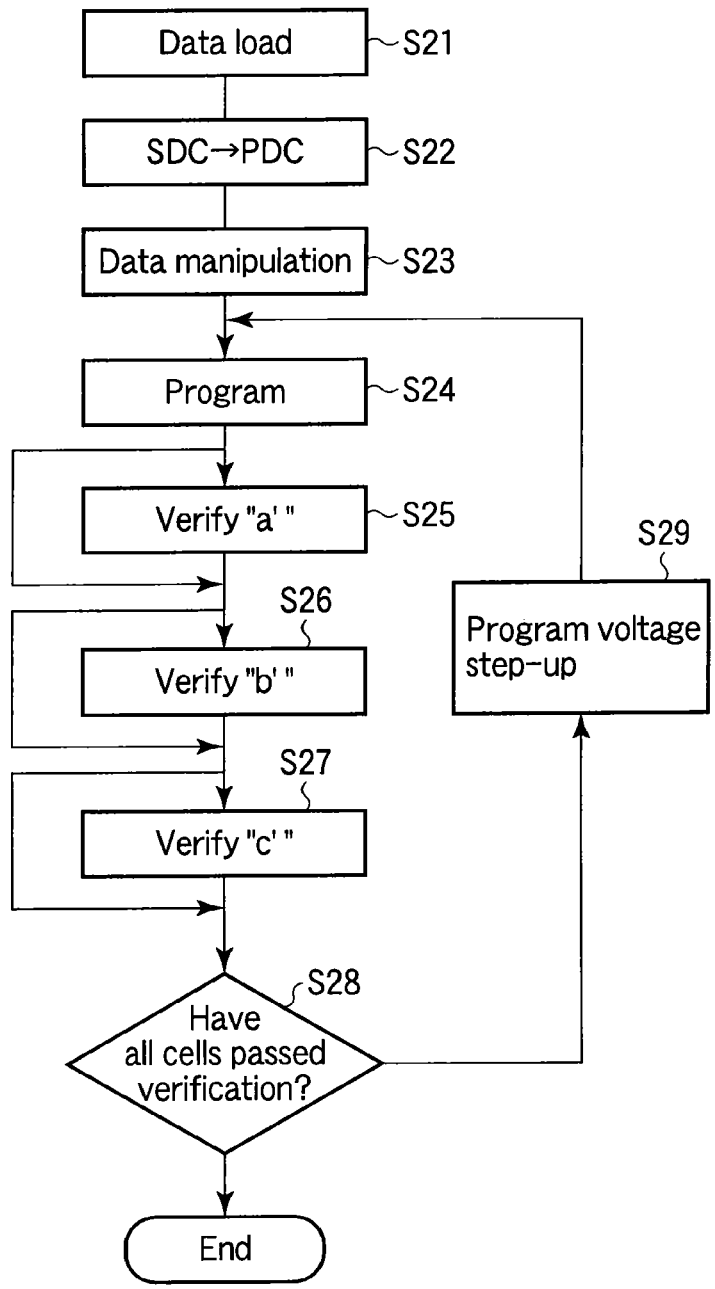
FIG. 11 is a flowchart to explain an example of a program (write) operation.

FIG. 11 is a flowchart of a program operation. In a program operation, first, an address is specified and, for example, a second page shown in FIG. 3 is selected. In this memory, a first page and a second page are written to simultaneously. First-page data to be written is externally input and stored in the SDCs of all the data storage circuits 10 (S21). Thereafter, when a transfer command is input, the data in the SDCs of all the data storage circuits 10 is transferred to the PDCs (S22). Similarly, second-page data is externally input and stored in the SDCs of all the data storage circuits 10. Thereafter, data manipulation is performed and data is set in the SDC, PDC, and DDC0 (S23). Then, a program operation is carried out.

(Program Operation) (S24).

Figure 12:
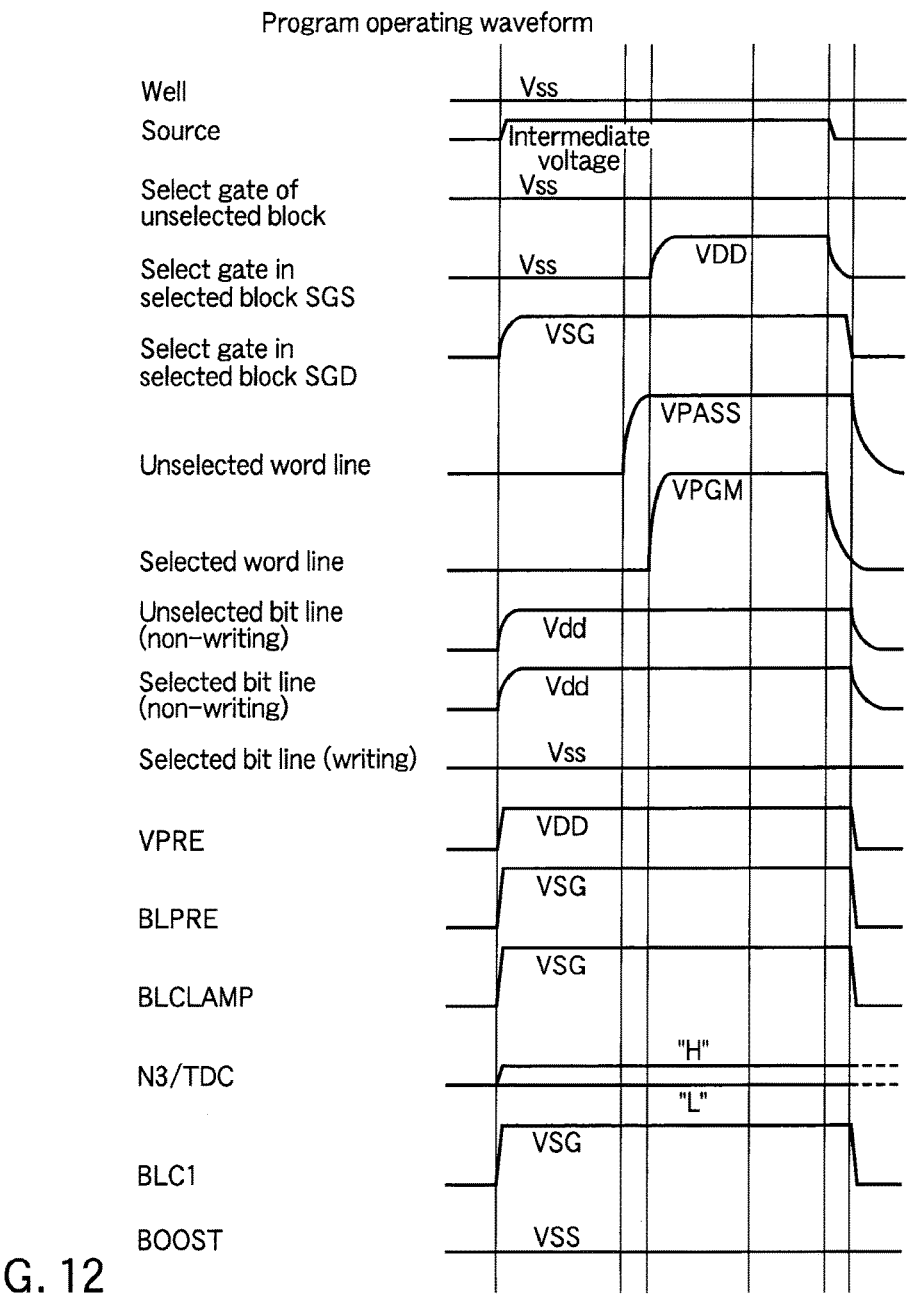
FIG. 12 is a timing chart to explain an example of a program operation.

FIG. 12 shows waveforms in a program operation. First, when signal BLC1 of the data storage circuit 10 of FIG. 7 is at Vdd+Vth, if the PDC has stored data "1" (no writing is done), the bit line goes to Vdd. If the PDC has stored data "0" (writing is done), the bit line goes to Vss. Furthermore, the cells which are connected to the selected word line and are on the unselected page (or whose bit lines are unselected) must not be written to. For this reason, the bit lines connected to those cells are also set to Vdd as when data "1" is stored.

Here, the select line SGD of the selected block is set at Vdd, program voltage VPGM (20V) is applied to the selected word line, and VPASS (10V) is applied to the unselected word lines. If the bit line is at Vss, the channel of the cell is at Vss and the word line is at VPGM, which causes writing to be done. If the bit line is at Vdd, the channel of the cell is not at Vss, but at about VPGM/2 by coupling, which prevents the cell from being programmed. After programming is done this way, the data in the memory cell is any one of "0," "1," "2," and "3."

(Program Verify)

A program verify operation carried out after writing is the same as a read operation. In this case, however, slightly higher potentials a', b', and c' than the potentials a, b, and c, respectively, in a read operation are supplied to the selected word line as shown in FIG. 8, thereby reading the data in the memory cell (S25, S26, S27). Hereinafter, "'" indicates a verify potential, which is slightly higher than the read potential. For example, if a=0V, then, a'=0.5V. As a result of a program verify operation, if the threshold voltage of the memory cell has reached a target threshold level, the PDC is set to "1" and is unselected in the next write operation (S28). As a result of a program verify operation, if the threshold voltage of the memory cell has not reached the target threshold level, the program voltage is slightly raised and programming is done again (S28, S29, S24). Such operations are repeated until all of the cells have been verified.

FIG. 27 shows the waveforms of a selected word line and an unselected word line are when potentials a', b', and c' (a, b and c) are sequentially applied to the selected word line at the time of a read operation and a verify read operation. A cell for which a write operation is performed to have "a" level has a low threshold value, and the write operation for that cell is completed in a short time. When there is no cell for which a write operation should be performed to have "a" level, a verify operation need not be performed at "a" level. In this case, therefore, the verify operation at the "a" level is not performed, and a verify operation is performed at "b" and "c" levels.

FIG. 28 shows the waveforms of a selected word line and an unselected word line are when potentials b' and c' are sequentially applied to the selected word line in a verify read operation. Since the unselected word line is raised to Vread, b' level shown in FIG. 28 is subject to the coupling between word lines, and is higher than "b'" level shown in FIG. 27. Therefore, where the verify operation is omitted, a sufficiently long time is needed for the selected word line to become stable after the unselected word line is in the state of Vread as shown in FIG. 29.

FIG. 30 shows a modification of FIG. 29. As shown in FIG. 30, a selected word line can be temporarily set at a previous level ("a" level). Before the time when the verify operation is omitted, "a" level will be raised due to the coupling between word lines. However, "a" level will be raised likewise at the time of a read operation as well, due to the coupling between words lines. In practice, therefore, there is no problem.

(Erase Operation)

An erase operation is carried out in units of a block shown by a dotted line in FIG. 3. After the erase operation, the threshold voltage of the memory cell is eventually data "0" as shown in FIG. 13. However, the characteristic of the memory cell is nonuniform. Moreover, its erase characteristic differs according to the threshold voltage corresponding to the data stored in the memory cell before the erasure. Therefore, after the erase operation, an erase verify operation is carried out.

Figure 15:
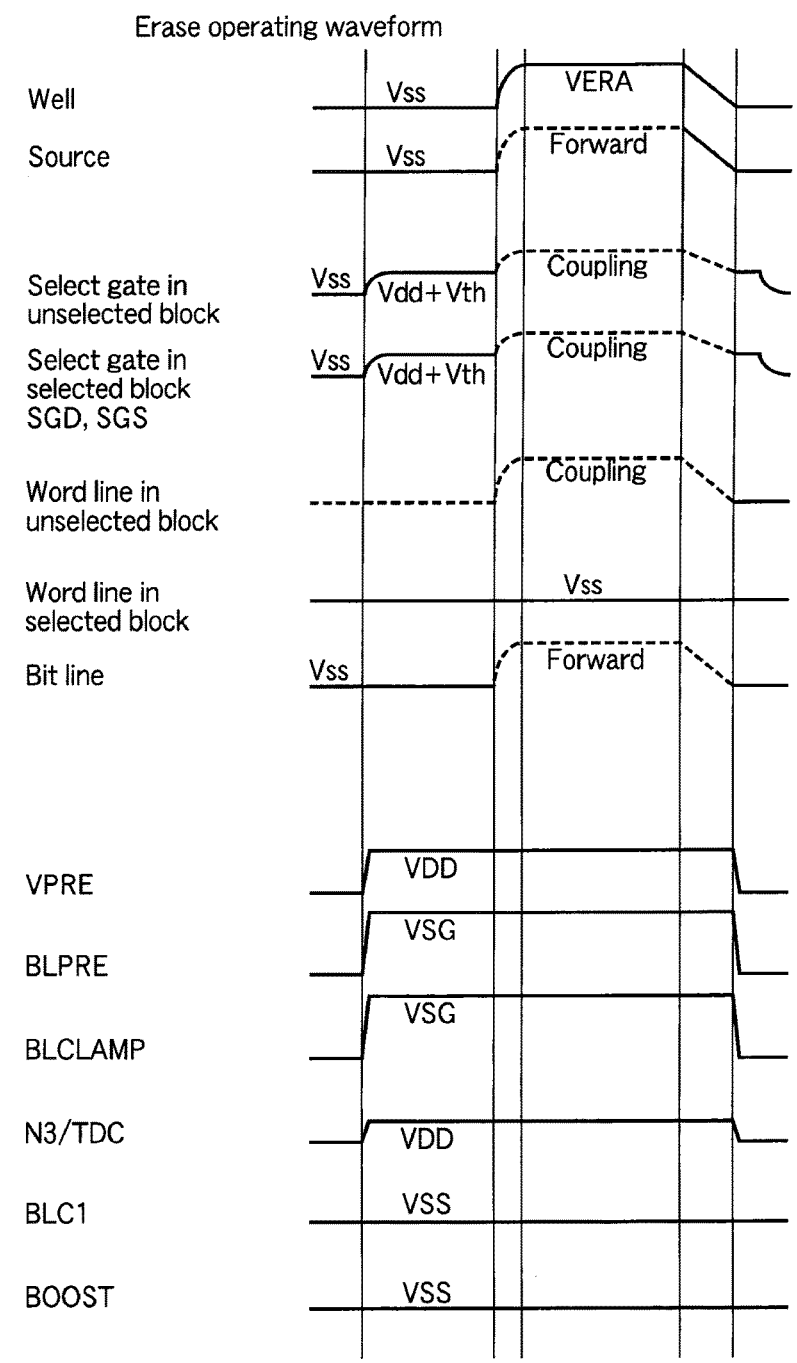
FIG. 15 is a timing chart to explain an example of an erase operation.

FIG. 14 is a flowchart of an erase operation. FIG. 15 shows waveforms in an erase operation. An erase operation is performed simultaneously on all the cells in the selected block. First, an erase voltage Vera is applied to the well of the selected block and the ground potential Vss is applied to all the word lines in the selected block, thereby carrying out an erase operation (S32). Next, an erase verify operation is performed (S33). The erase verify operation is performed simultaneously on all the cells in the selected block by, for example, a source-follower method. As a result, if the threshold voltages of all the memory cells have not reached the threshold voltage of data "0," that is, if the verification has not been passed, the erase voltage is stepped up (S34, S35) and the erase operation is repeated.

If the verification has been passed, a soft program operation (S36) for raising the threshold voltage slightly and a soft program verify operation (S37) are performed on the over-erased cells. As a result, if all of the NAND strings have not passed the verification, the erase operation is carried out again (S38, S32). If all the NAND strings have passed the verification, the erase operation is terminated. When the soft program operation is unnecessary, the soft program operation (S36), soft program verity operation (S37), and decision operation (S38) are omitted.

While an erase verify operation has been performed on all the memory cells in step 34 of FIG. 14 and on all the NAND strings in steps S36d, 38, the invention is not limited to this. For instance, a specified value may be used to determine whether the number of memory cells or NAND strings which have failed to pass the verification is equal to or smaller than the specified value.

Here, the source-follower erase verify operation will be explained.

Figure 16:
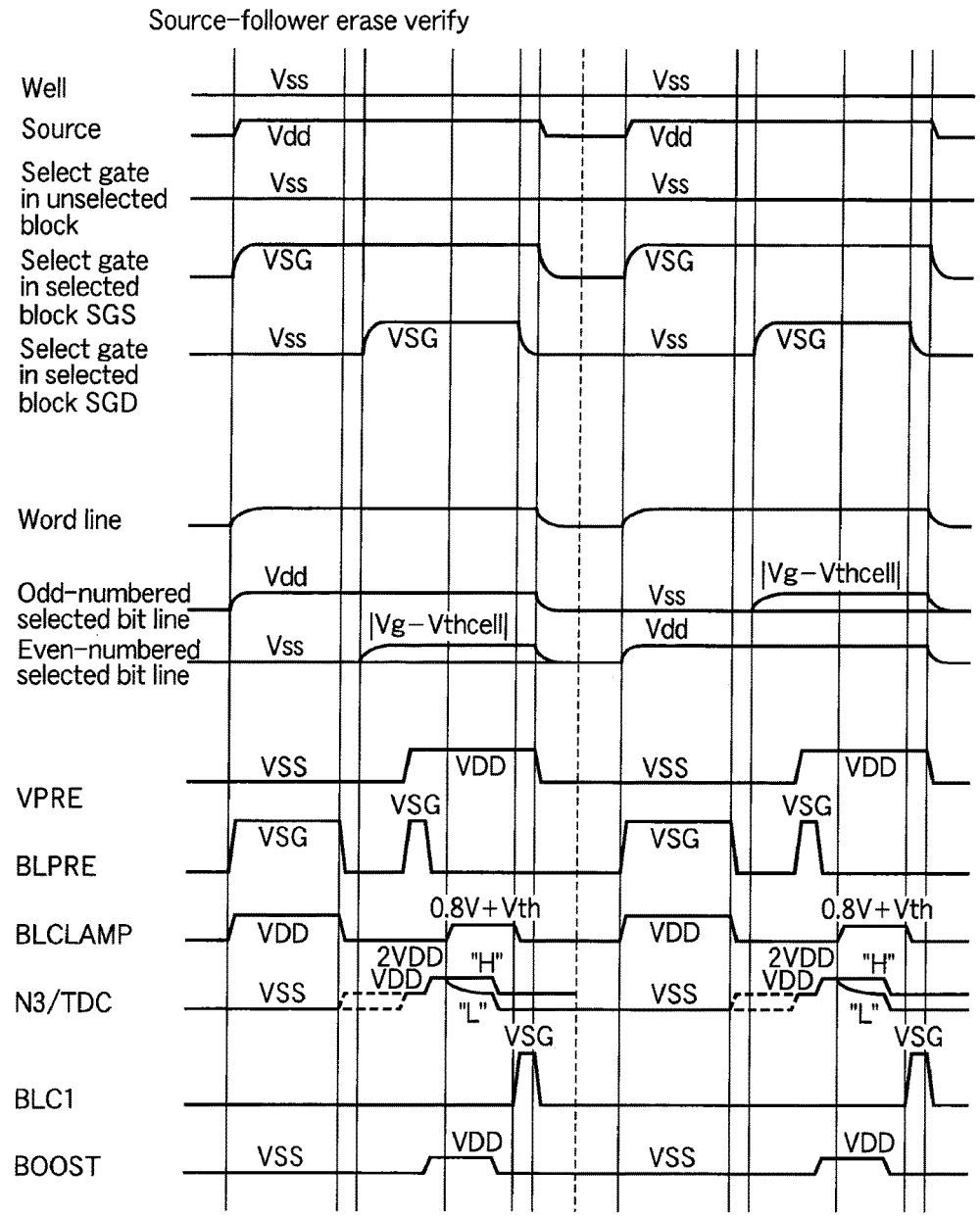
FIG. 16 is a timing chart to explain a source-follower verify operation.

FIG. 16 is a timing chart of the source-follower erase verify operation. In the erase verify operation, all the cells connected to an even-numbered bit line in the selected block are verified simultaneously. Thereafter, all the cells connected to an odd-numbered bit line in the selected block are verified simultaneously. That is, first, a specific voltage is applied to the word line, an even-numbered selected bit line in the selected block is set to Vss, and an odd-numbered selected bit line is set to Vdd. In parallel with this, the source is set to Vdd and the select gate SGS on the source side is turned on.

Then, if, for example, the voltage of the word line is 0V and the threshold voltages of the cells in the NAND string are −2V, −1.5V, −0.5V, and −1V (actually, a NAND string includes 32 cells or 64 cells), the voltage of the selected bit line is Vg−Vth. Thus, it follows that 0V−(−0.5V (the threshold voltage of a cell whose threshold voltage is shallowest))=0.5V. Here, after node N3 of the TDC of FIG. 7 is precharged to Vdd, signal BOOST is changed from Vss to Vdd and node N3 of the TDC is set to 2Vdd and then signal BLCLAMP is set to, for example, 0.8V+Vth. Since the voltage of the bit line is at 0.5V, node N3 of the TDC is low. Thereafter, signal BOOST is changed from Vdd to Vss and signal BLC1 is made high, which latches node N3 of the TDC low.

On the other hand, if the threshold voltages of the cells in the NAND string are −2V, −1.5V, −1V, and −1.1V, the voltage of the bit line is Vg−Vth=0V−(−1V (the threshold voltage of a cell whose threshold voltage is shallowest))=1.0V. Here, after node N3 of the TDC is precharged to Vdd, signal BOOST is changed from Vss to Vdd and the TDC is set to 2Vdd and then signal BLCLAMP is set to, for example, 0.8V+Vth. Since the voltage of the bit line is 1V, node N3 of the TDC is high. Thereafter, signal BOOST is changed from Vdd to Vss and signal BLC1 is made high, which latches node N3 of the TDC high. That is, if the threshold voltage of the cell is equal to or lower than −0.8V, node N3 of the TDC goes high. If the threshold voltage of the cell is higher than −0.8V, node N3 of the TDC goes low.

Thereafter, the memory cells connected an odd-numbered bit line are verified as the memory cells connected to an even-numbered bit line are. Thereafter, the result of the verification of the memory cells connected to the even-numbered bit line is added to that of the memory cells connected to the odd-numbered bit line. Then, all the cells in the selected block are caused to reach an erase verify level. As a result of this, if all the cells have not reached the erase verify level, the erase voltage is raised again and the erase operation is carried out.

Thereafter, the soft program operation is carried out and weak writing is performed so as to prevent the threshold voltage after erasure from becoming too deep. When an Erased Area Self Boost (EASB) write system is used as shown in FIG. 17, the soft program operation has the following problem. In the EASB write system, writing is performed, beginning with the cell on the source line side. For example, the erase level of a cell whose word line is set to Vss is too deep, the cell does not go off. For this reason, when data "1" is written to a cell (in a non-write operation), the part directly below the cell to whose word line a program voltage Vpgm is applied is booted, which makes it impossible to perform a non-write operation. Accordingly, as shown in FIG. 14, after the erase operation, all the word lines are selected and a soft program operation is carried out (S36). Thereafter, all the NAND strings are subjected to a soft program verify operation (S37). The soft program verify operation is identical with an erase verify operation (S33). However, the soft program verify level, which is shallower than an erase verify level of −0.8V, is, for example, −0.5V. Accordingly, the voltage of the word line is set to 0.3V or signal BLCLAMP is set to 0.5V.

Furthermore, as shown in FIG. 18, in a soft program verify operation, when a cell whose threshold voltage after erasure is the shallowest in the NAND string has exceeded soft program verify level 1, the next soft program is prevented from being written to the cell. In this way, writing is done in such a manner that the cells in all the NAND strings exceed the soft program verify level. Thereafter, the soft program verify level is raised slightly and a check is made to see if all of the cells are at a level equal to or lower than the slightly raised soft program verify level 2. As a result, if they are not at a level equal to or lower than the slightly raised soft program verify level 2, the erase operation is carried out again. Even if the soft program operation is not carried out during the erase operation, level "0" may be written during the program operation. When the soft program operation is unnecessary, of course, it may be omitted.

(First Embodiment)

When a NAND flash memory is erased and written to repeatedly, it becomes more difficult to erase. Therefore, the erase voltage has to be raised. Accordingly, before shipment, the erase voltage has to be raised to some extent so that erasing may be performed even after erasing and writing have been done a certain number of times. However, if the erase voltage is high, the following problem arises: a stress is applied on the cell, which accelerates the deterioration of the cell.

To overcome this problem, a first embodiment of the invention performs erasing at an erase voltage lower than a normal one and then reads the data from the NAND strings in a block simultaneously in an erase verify operation and counts the number of unerased memory cells. According to the counted number of unerased cells, the next erase voltage is set. Using the set erase voltage, an erase operation is carried out.

FIG. 19 shows the transition of a threshold voltage distribution in the first embodiment. In the state shown in FIG. 19A, when a weak erase operation is carried out at an erase voltage lower than a normal one, there is a cell which has not been erased sufficiently. Then, the number of memory cells which have exceeded a weak erase verify level is counted and the next erase voltage is determined according to the counted number. Erasing is done at the determined erase voltage, thereby setting the threshold voltage distribution of the memory cell below the erase verify level as shown in FIG. 19C.

Figure 20:
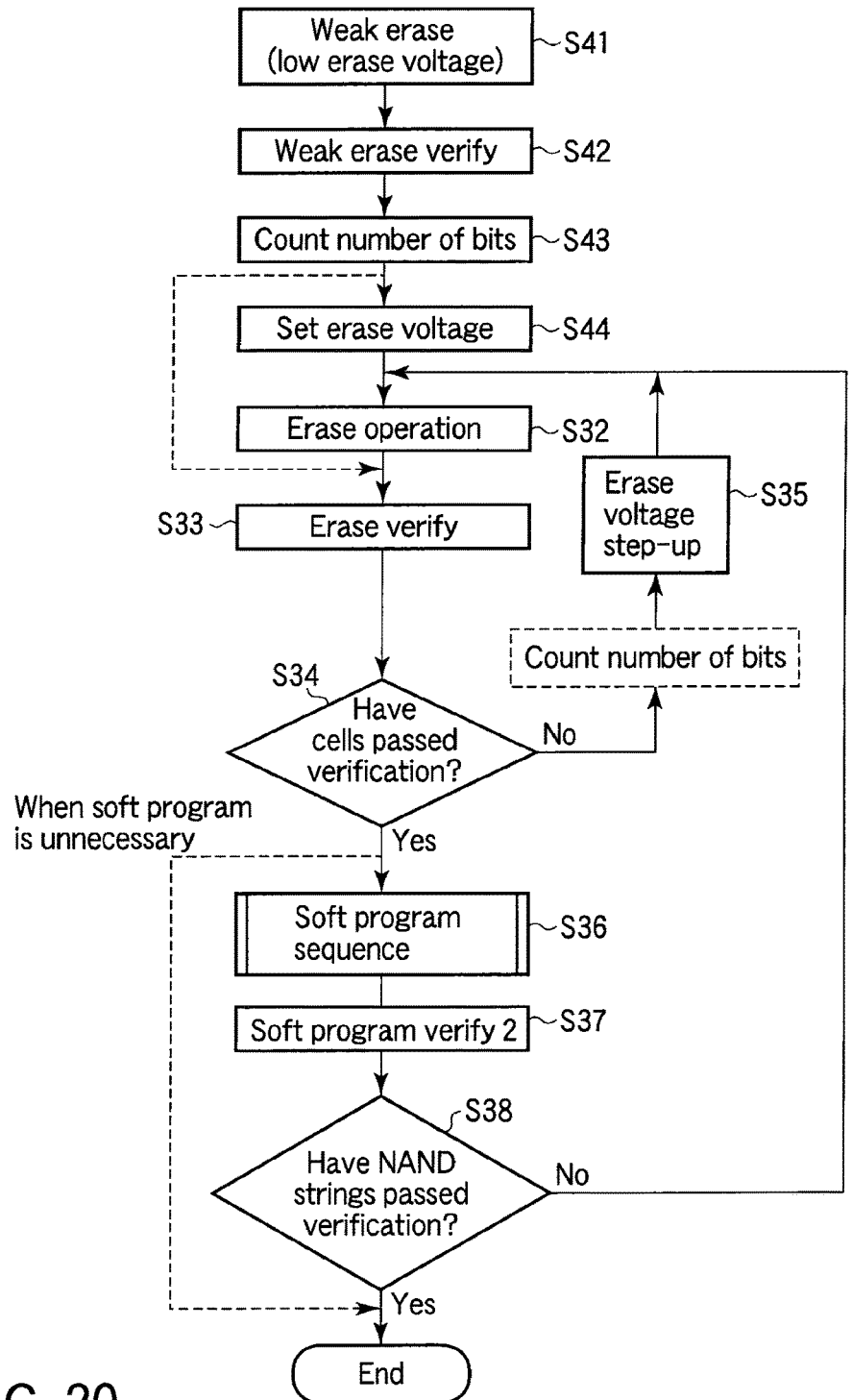
FIG. 20 is a flowchart to explain a weak erase operation according to a first embodiment of the invention.

FIG. 20 shows an erase sequence according to the first embodiment. In FIG. 20, the same parts as those in the erase sequence of FIG. 14 are indicated by the same reference numerals.

In the first embodiment, first, weak erasing is done using a first erase voltage lower than a normal one (S41). The first erase voltage is set to, for example, 20V, whereas a conventional erase voltage is, for example, 22V. The first erase voltage is not restricted to 20V and may be set to another voltage. Thereafter, a weak erase verify operation is carried out (S42). In the weak erase verify operation, which is the same as the erase verify operation shown in FIG. 14, the level of the word line or the level of signal BLCLAMP is changed and a determination is made at a first verify level (a weak erase level) higher than the erase verify level. Next, the number of NAND strings including memory cells higher than the first verify level is counted (S43). Specifically, as a result of the above-described simultaneous verify operation, high is latched in the PDC of the data storage circuit 10 connected to a NAND string including memory cells whose threshold voltage is higher than the first verify level. The data in the PDC is supplied to the counter 9 of FIG. 1 via the SDC, data lines IO, Ion, or wiring line COMi and is counted (S43). The counted value of the counter 9 is supplied to the control signal and control voltage generator circuit 7. The control signal and control voltage generator circuit 7 sets an erase voltage used for the next erase operation according to the output signal of the counter 9 (S44). For example, if the counted value is larger than a specified value, there are many memory cells erased insufficiently. In this case, the step width of the erase voltage is set greater and the erase voltage is set higher. Thereafter, in the same manner as explained in FIG. 14, an erase operation (S32), an erase verify operation (S33), and a soft program operation (S36) are executed. If a soft program operation is unnecessary, it may be omitted.

In the first embodiment, after weak erasing is performed at the first erase voltage lower than a normal one, a verify operation is carried out at the first erase verify voltage higher than a normal erase verify level, the number of NAND strings failing to pass the verify operation is counted, and the next erase voltage is set according to the counted value. Accordingly, in erase operations after this, the number of times an erase pulse is applied to the memory cells can be reduced, which enables not only the erase time to be shortened but also stress applied to the memory cells to be reduced. Furthermore, in the early stage of erasure, a suitable erase voltage can be set, which enables the accuracy of erasure to be improved.

As shown in FIG. 19A, when there are many memory cells whose threshold distribution before erasure is "0" or when all the memory cell are at "0," if a weak erase verify operation is carried out after weak erasing is done, the number of cells whose threshold level is higher than that level is very small or zero. In this case, an erase operation is not carried out and an erase verify operation is carried out. Normally, however, a host composed of a microcomputer connected outside the chip of the NAND flash memory has known whether erasing has been done. Accordingly, erasing an erased cell frequently causes no problem. Moreover, even when all the data items are at "0," this frequently causes no problem because the host outside the chip performs randomizing so that all the data items may not become the same. In addition, the hosts outside the chip are randomized in many cases so as to avoid the situation where all data are the same. Since the state where all data are "0" is rare, such a state does not become a problem in practice.

Figure 21A:
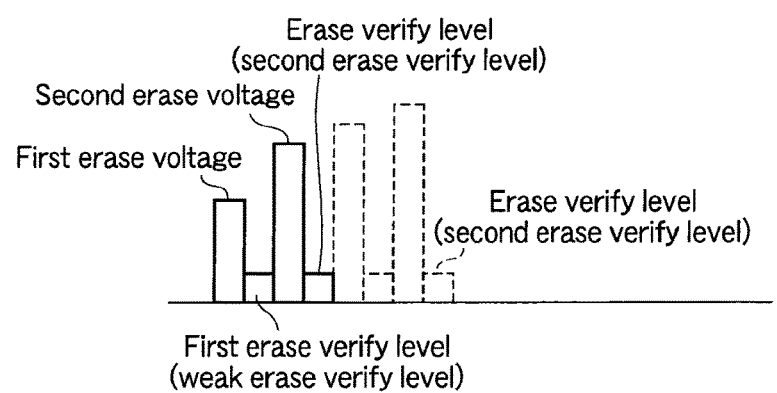
FIG. 21A shows the relationship between an erase voltage and an erase verify voltage in a weak erase operation and FIG. 21B shows the relationship between an erase voltage and an erase verify voltage in a normal erase operation.
Figure 21B:
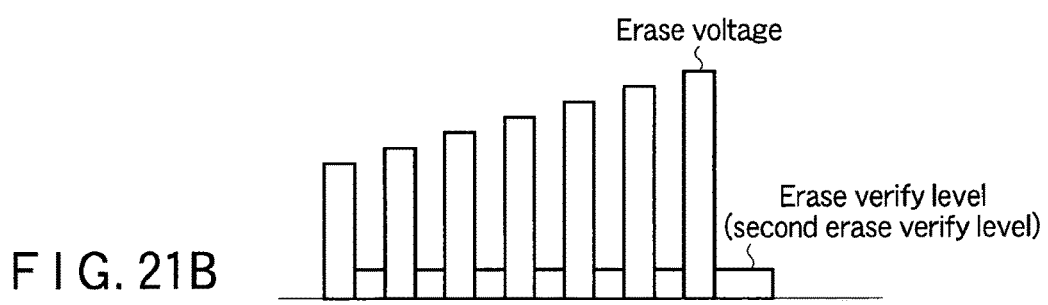

FIG. 21 shows the relationship between erase voltages and verify voltages are in the first embodiment. FIG. 21A relates to the first embodiment and FIG. 21B shows the erase operation shown in FIG. 14. In the first embodiment, a second erase voltage is set on the basis of the first erase voltage, a weak erase verify operation using the first erase verify level, and the result of the weak erase verify operation. Accordingly, the voltages of the second and later erase pulses can be set properly. Therefore, the number of times an erase operation is repeated can be reduced as compared with ordinary erasure shown in FIG. 21B.

As shown by a broken line in FIG. 20, when the verification is not passed in step S34, the number of insufficiently erased memory cells may be counted and, on the basis of the counted value, the erase voltage may be changed. In addition, the number of bits may be counted immediately after the erase verify operation S33.

(Second Embodiment)

FIG. 22 shows an erase sequence according to a second embodiment of the invention. In FIG. 22, the same parts as those of FIG. 22 are indicated by the same reference numerals.

In the first embodiment shown in FIG. 14 or FIG. 20, all the NAND strings are verified simultaneously by the source-follower method of FIG. 16 in the weak erase verify operation, erase verify operation, soft program verify operation 1, and soft program verify operation 2. However, the source-follower read operation is low in accuracy because it is different from a normal read operation and a program verify read operation. Moreover, in an erase operation, all the cells in a block are erased and therefore most of the cells must have been erased similarly. In addition, in a soft program operation after erasure, all the cells in a block are written to simultaneously and therefore most of the cells must have been written to similarly. Accordingly, in the second embodiment, only specific word lines in a block are verified after weak erasure using a normal read operation and a program verify read operation.

One or more word lines are put in the selected state and the other word lines are put in the unselected state. In this state, reading may be done in a source follower method by applying a voltage higher than that applied to the selected word line.

For example, in FIG. 22, first, weak erasing is performed using a low erase voltage as in the first embodiment (S41). Thereafter, a weak erase verify operation is carried out (S51). The weak erase verify operation is performed on, for example, a specific single word line or multiple word lines by the source-follower method or in the same manner as the above-described ordinary read operation and program verify read operation. In this case, however, the first verify level is used. When the position of a cell to be erased later is known in advance from, for example, the layout, the word line which selects the cell is used as the specific word line.

Thereafter, as in the first embodiment, the number of memory cells higher than the weak erase verify level read into the data storage circuit 10 is counted by the counter 9 (S43). Since the erase voltage is low, the number of memory cells whose threshold voltage is higher than the weak erase verify level is considerably large. According to the counted value, the control signal and control voltage generator circuit 7 sets the next erase voltage (S44). Using the set erase voltage, an erase operation is carried out again (S32).

Thereafter, an erase verify operation and a soft program operation are carried out as in the first embodiment. If the soft program operation is unnecessary, it may be omitted.

In the weak erase verify operation, erase verify operation, and soft program verify operation, the number of word lines is not limited to one. Multiple word lines may be selected at the same time and verify reading may be performed. In addition, one or more word lines may be scanned sequentially and verify reading be done. Then, the read results may be summed. Because of this summing operation, a verify operation can be performed reliably for cells in a selected block.

Figure 24:
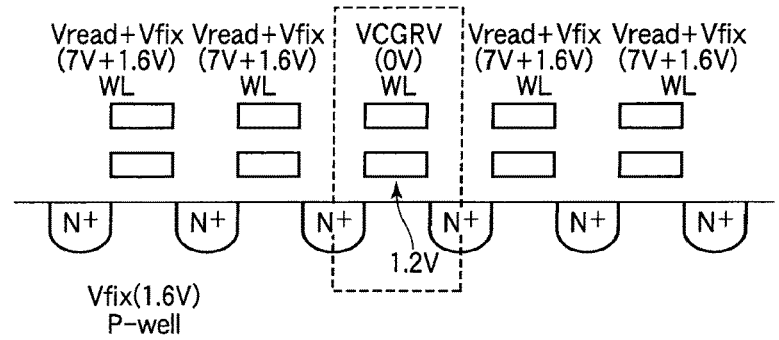
FIG. 24 shows the relationship between potentials in a verify operation in the second embodiment.

FIG. 24 shows the relationship between the potential of the word line and that of the floating gate in a normal read operation and a program verify read operation when one or more word lines are selected and a verify operation is carried out. In FIG. 24, since the word line of a cell adjacent to the selected cell is as high as Vread+Vfix (e.g., 7V+1.6V), the floating gate of the selected cell enclosed by a broken line is at, for example, about 1.2V through coupling even when the selected word line is at 0V, for example. In the weak erase verify, erase verify, and soft program verify operations, the threshold voltage of the cell is low. Therefore, as high a voltage as Vread+Vfix (e.g., 7V+1.6V) need not be applied to the word lines (WLs) of the unselected cells.

Figure 25:
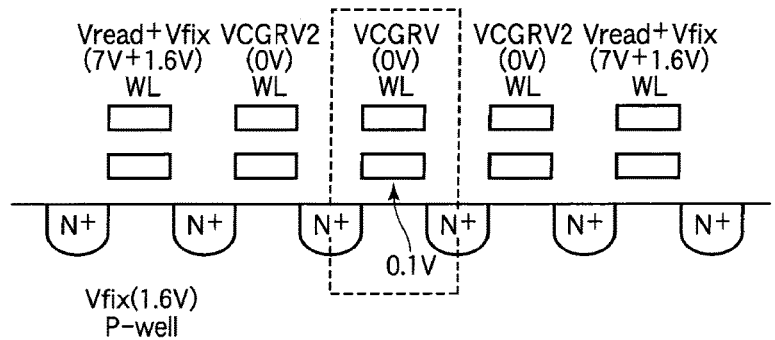
FIG. 25 shows the relationship between potentials in a verify operation in the second embodiment.

As shown in FIG. 25, the word line of a cell adjacent to the selected cell is set to a voltage VCGRV2, for example, 0V. Then, the floating gate of the selected cell is at a lower voltage than in FIG. 24, for example, at 0.1V. In this state, the word line of the selected cell is set to VCGRV (e.g., 0V) and a verify operation is carried out.

Figure 26:
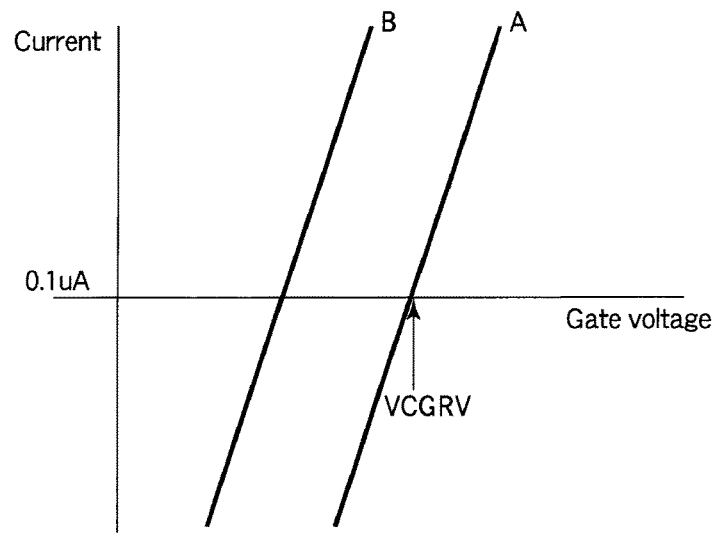
FIG. 26 shows the relationship between the gage voltage and the current in a verify operation in the second embodiment.

FIG. 26 shows the relationships between the gate voltage and gate current of a memory cell. Electrons accumulated in a floating gate cause a change in the characteristics of a memory cell, and a gate voltage that causes a current of 0.1 μA to flow through a memory cell is defined as a threshold voltage. Characteristic A in FIG. 26 shows a case where a verify operation is carried out at the voltage shown in FIG. 25. The verify operation for the memory cell is completed according to characteristic A shown in FIG. 26. In contrast, in a normal read operation and a program verify read operation, the potential of the word line of a cell adjacent to the selected cell is as high as Vread+Vfix (e.g., 7V+1.6V) as shown in FIG. 24. Even if the verify operation is completed according to characteristic A shown in FIG. 26, the change of the read method results in characteristic B shown in FIG. 26. Accordingly, lowering the level of the word line of a cell adjacent to the selected cell enables a verify operation to be performed at a lower threshold value.

Furthermore, when data is read from a cell adjacent to select gate S1 or S2 shown in FIG. 2 (the cell connected to word line WL0, WL31), the voltage of select line SGS or SGD cannot be lowered. A cell adjacent to select gate S1 or S2 sometimes has a poor characteristic. For this reason, in recent products, a cell adjacent to select gate S1 or S2 is used not as a cell for storing actual data but as a dummy and therefore there is no problem.

Moreover, when all the word lines are selected one by one and reading is done, an erase voltage is applied to a word line on which there are insufficiently erased cells the number of which is equal to or larger than a specified value after the erase verify operation, whereas a non-erase voltage is applied to a word line on which there are insufficiently erased cells the number of which is less than the specified value. With the erase or non-erase voltage being applied this way, an erase operation is carried out again. Erasing may be performed by repeating those operations.

In addition, when all the word lines are selected one by one and reading is done, a writing voltage is applied to a word line on which there are insufficiently soft-programmed cells the number of which is equal to or larger than a specified value after the soft program operation, whereas a non-writing voltage is applied to a word line on which there are insufficiently soft-programmed cells the number of which is less than the specified value. With the writing or non-writing voltage being applied this way, a soft program operation is carried out again. Soft programming may be performed by repeating those operations.

In the second embodiment, after weak erasing is performed, the weak erase verify, erase verify, and soft program verify operations are carried out as in a normal read operation or a verify read operation. Therefore, the data in a memory cell can be read at high accuracy, which enables the number of insufficiently erased cells to be counted accurately. Accordingly, it is possible to accurately set an erase voltage for the next erasure. This enables the number of times an erase pulse is applied to be reduced further, which helps shorten the erase time and alleviate stress on the memory cells.

In the case where the weak erase verify operation shown in FIG. 14 is not performed, normal reading or source-follower reading may be performed, with one or more word lines being put in the selected states. Furthermore, with one or more word lines being put in the selected state, a sequential scan and a verify reading operation may be carried out, and reading results may be summed. By performing this summing, a verify operation can be carried out reliably for cells within a selected block.

(Third Embodiment)

Figure 23:
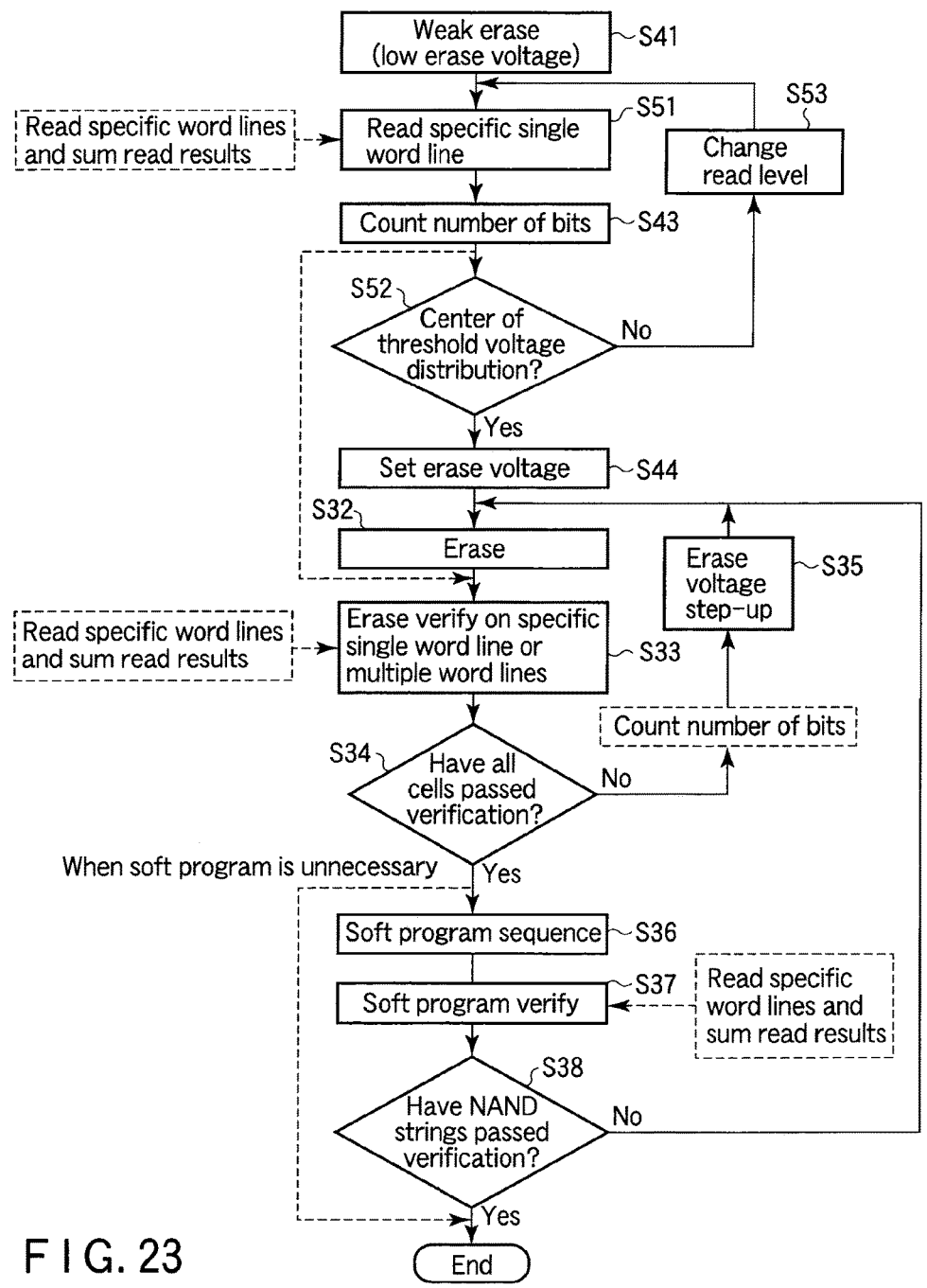
FIG. 23 is a flowchart to explain a weak erase operation according to a third embodiment of the invention.

FIG. 23 shows an erase sequence according to a third embodiment of the invention. In the third embodiment, the same parts as those in the second embodiment are indicated by the same reference numerals. In the second embodiment, after weak erasing is done using a low erase voltage, only specific word lines in a block are subjected to a weak verify operation using a normal read operation and a program verify read operation. The number of cells higher than the weak erase verify level is counted. According to the counted value, an erase voltage is set and the next erase operation is carried out.

In contrast, in the third embodiment, reading is done a plurality of times, while changing the weak erase verify level gradually. Then, the center of the threshold voltage distribution is determined. According to the level of the center of the threshold voltage distribution, an erase voltage is set. Then, the next erase operation is carried out. The reading method of performing a read operation a plurality of times, while changing the weak erase verify level gradually is identical with that in a normal read operation and a program verify read operation.

That is, as shown in FIG. 23, first, weak erasing is done using a low erase voltage (S41). Thereafter, only a specific single word line in the block is subjected to a weak erase verify operation using a normal read operation and a program verify read operation (S51). The weak erase verify operation may be carried out using specific two or more word lines as in the second embodiment. Next, the counter 9 counts the number of cells higher than the weak erase verify level (S43). Thereafter, it is determined whether the counted value is the center of the threshold voltage distribution (S52). That is, for example, the counted value of the counter 9 is compared with the preceding counted value to determine whether the counted value has reached the maximum. Thus, the counted value is held in, for example, a register. If the result of the determination has shown the counted value has not reached the maximum, the read level, or the weak erase verify level, is increased slightly (S53). Using the increased weak erase verify level, the specific word line is subjected to a weak erase verify operation (S51), the number of cells is counted (S43), and it is determined whether the counted value is the center of the threshold voltage distribution (S52). As a result, if the result has shown that the counted value is the center of the threshold voltage distribution, the next erase voltage is set according to the counted value (S44). Thereafter, using the set erase voltage, an erase operation (S32), a verify operation (S34), a soft program sequence (S36), and a soft program verify operation (S37) are carried out. If the soft program operation is unnecessary, it may be omitted.

In the third embodiment, after weak erasing is done, the threshold voltage of the memory cell connected to the specific word line is verified, while changing the weak erase verify level. The number of cells which have exceeded the weak erase verify level is counted. On the basis of the counted value, the center of the threshold voltage distribution is detected. According to the center of the threshold voltage distribution, the next erase voltage is set. Accordingly, the next erase voltage can be set more reliably, which enables the memory cells to be erased using fewer erase pulses. Consequently, not only can the erase time be shortened, but also stress on the memory cells can be alleviated.

Of course, with one or more word lines being put in the selected state, a normal read operation or a source-follower read operation maybe used. Furthermore, with one or more word lines being put in the selected state, a sequential scan and a verify reading operation may be carried out, and reading results may be summed. By performing this summing, a verify operation can be carried out reliably for cells within a selected block.

In step S34 of FIGS. 20, 22, and 23, all the memory cells have been verified and, in step S37, all the NAND strings have been verified. The invention is not limited to this. For instance, as in FIG. 14, for example, a specified value may be used to determine whether the number of memory cells or NAND strings which have failed to pass the verification is equal to or less than the specified value.

Furthermore, as in FIG. 20, in FIGS. 22 and 23, if the verification has not been passed, the number of insufficiently erased memory cells may be counted and the erase voltage be changed according to the counted value. In addition, the number of bits may be counted immediately after the erase verify operation in step S33.

In the conventional case shown in FIG. 14 and in the embodiments shown in FIGS. 20, 22 and 23, an erase operation is carried out simultaneously for all cells within a selected block on the basis of the timing shown in FIG. 15.

FIG. 31 shows an example of the memory cell array and row decoder depicted in FIGS. 2 and 3. As described above, it is known that cells adjacent to a select gate are poor in characteristics. Therefore, the cells adjacent to the select gate are used as dummy cells; they are not used for storing data. However, since the erase operation is performed in units of blocks, all cells within a block are erased, and subsequently a soft program operation is simultaneously carried out for all cells within the block. As a result, the dummy cells are degraded. Since the dummy cells are located adjacent to the select gate, their characteristics may be lower than the characteristics of other cells. As compared with normal cells, the dummy cells may have very poor characteristics.

FIG. 32 shows a waveform corresponding to the case where an erase operation is performed for conventional dummy cells. As shown in FIG. 33, however, the erase operation is eased where the voltages of word lines WLDD and WLDS that are undergoing the erase operation are set at 0.5V or 1V, for example. Since the erase operation is not fully performed, the dummy cells are prevented from degrading. To further ease the erase operation, it is possible to apply a high voltage to the word lines. However, signal TransferG supplied to the gate of a transistor used for selecting the row decoder of a selected block is set at Vdd at the time of an erase operation. Therefore, a voltage higher than Vdd cannot be applied to the word lines through the transistor.

As shown in FIG. 34, signal TransferG supplied to the gate of the transistor used for selecting the row decoder of the selected block can be set at a voltage higher than Vdd, for example, at VreadH which is equal to the voltage applied at the time of a read operation. In this case, a voltage higher than Vdd can be applied to the word lines.

As shown in FIG. 35, signal TransferG supplied to the gate of the transistor used for selecting the row decoder of the selected block is set at Vdd, and the driving circuit for driving dummy word lines WLDD and WLDS is set at Vdd. In response to this, only the transistor used for selecting the row decoder of the dummy cells is turned off, and the potential of dummy word lines WLDD and WLDS becomes high due to coupling. As a result, the dummy cell can be put in the unselected state. In this case, however, the word lines of the dummy cells are set become high in potential, and the word lines of the cells adjacent to the dummy cell become higher than Vss as a result of coupling. Accordingly, the erase operation may take time.

In this case, as shown in FIG. 36, Vss is supplied to word lines WL0 and WL31, which are adjacent to dummy word lines WLDD and WLDS, and a voltage slightly lower than Vss (which is predetermined and is 0.5V or 1V, for example) is supplied to the other word lines WL1-WL30, so as to make an erase operation slightly hard to perform. In this manner, the erase operation for the cells corresponding to word lines WL0 and WL31 adjacent to the dummy word lines and the erase operation for the cells corresponding to the other word lines WL1-WL30 are equalized in the degree of easiness.

Even where the erase operation for the dummy word lines is eased, the erase operation itself is made disabled, or the erase operation is not eased, it is still true that the characteristics of the dummy cells are different from those of the other cells. It is therefore probable that the erase operation cannot be performed to the intended erase level and the verify operation is not performed normally. In this case, a voltage higher than the voltage applied to a selected word line is applied to the dummy word lines (for example, Vdd or Vread are applied to them), so as to exclude the dummy word lines from the word lines to be verified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which memory cells are provided;
   word lines, including a first word line, a second word line and third word lines, connected to the memory cells, and the third word lines located between the first and second word lines; and
   a control circuit,
   wherein the memory cell array has at least two select transistors, the memory cells are connected in series between the select transistors, the select transistors have gates connected to at least two select lines, the first word line is connected to a first memory cell of the memory cells next to at least one of the select transistors, the second word line is connected to a second memory cell of the memory cells next to at least another one of the select transistors, and the third word lines are connected to third memory cells of the memory cells, and
   wherein the control circuit erases the first, second and third memory cells in an erase operation, the control circuit verifies the third memory cells in an erase verify operation after the erase operation, and the control circuit, in the erase verify operation, sets a first voltage to the first word line, sets a second voltage to the second word line, and sets a third voltage less than the first and second voltages to the third word lines.

2. The device according to claim 1, further comprising first transistors connected to the select lines;
   a second transistor connected to the first word line;

a third transistor connected to the second word line; and fourth transistors connected to the third word lines,
wherein gates of the first, second, third and fourth transistors are connected in common.

3. The device according to claim 2,
wherein in the erase operation, gates of the first, second, third and fourth transistors are set to a fourth voltage greater than a fifth voltage supplied to the select lines, and a sixth voltage greater than or equal to the fifth voltage is supplied to the first and second word lines.

4. The device according to claim 2,
wherein in the erase operation, gates of the first, second, third and fourth transistors are set to a seventh voltage greater than an eighth voltage supplied to the select lines minus a voltage Vth, wherein Vth is a threshold voltage of the first, second, third and fourth transistors, and the eighth voltage is supplied to the first and second word lines.

5. The device according to claim 2,
wherein the control circuit, in the erase operation, sets a ninth voltage greater than the first and second voltages to the select lines.

6. The device according to claim 2,
wherein the control circuit verifies the third memory cells in the erase verify operation and does not verify the first and second memory cells in the erase verify operation.

7. The device according to claim 1,
wherein the control circuit, in the erase verify operation, sets a tenth voltage greater than the first and second voltages to the select lines.

8. The device according to claim 1,
wherein the control circuit, in the erase operation, sets an eleventh voltage to the first word line, sets a twelfth voltage to the second word line, and sets a thirteenth voltage less than the eleventh and twelfth voltages to the third word lines.

9. The device according to claim 8,
wherein the control circuit, in the erase operation, sets a fourteenth voltage greater than the eleventh and twelfth voltages to the select lines.

10. The device according to claim 1,
wherein the control circuit does not verify the first and second memory cells in the erase verify operation.

11. The device according to claim 1,
wherein the first and second memory cells are dummy cells.

12. The device according to claim 1,
wherein at least one of the memory cells includes source/drain layers in semiconductor substrate, a gate insulating layer on the semiconductor substrate, a floating gate electrode on the gate insulating layer, an insulating layer on the floating gate electrode, and a control gate electrode on the insulating layer.

13. The device according to claim 1,
wherein the memory cells are arranged on a semiconductor substrate in a two-dimensional form.

* * * * *